(12) United States Patent
Fang et al.

(10) Patent No.: US 10,269,672 B2
(45) Date of Patent: Apr. 23, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Jen-Kuang Fang, Kaohsiung (TW); Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 2 days.

(21) Appl. No.: 15/685,869

(22) Filed: Aug. 24, 2017

(65) Prior Publication Data

US 2019/0067142 A1 Feb. 28, 2019

(51) Int. Cl.

| | |
|---|---|
| *H01L 23/00* | (2006.01) |
| *H01L 23/31* | (2006.01) |
| *H01L 23/498* | (2006.01) |
| *H01R 12/75* | (2011.01) |
| *H05K 3/30* | (2006.01) |
| *H01L 21/48* | (2006.01) |
| *H01L 21/768* | (2006.01) |
| *H01L 25/065* | (2006.01) |

(Continued)

(52) U.S. Cl.
CPC ........ *H01L 23/3114* (2013.01); *B23K 3/0623* (2013.01); *H01L 21/4814* (2013.01); *H01L 21/76885* (2013.01); *H01L 24/11* (2013.01); *H01L 25/0657* (2013.01); *H01L 25/50* (2013.01); *H01L 2224/1308* (2013.01); *H01L 2224/48227* (2013.01); *H01L 2924/01014* (2013.01); *H01L 2924/01029* (2013.01); *H01L 2924/01074* (2013.01)

(58) Field of Classification Search
CPC ........... H01L 23/3142; H01L 23/49838; H01L 24/81; H01L 24/05; H01L 23/49822; H01L 23/3185; H01L 21/563; H01L 21/4853; H01L 23/13; H01L 23/49811; H01L 23/49816; H01L 23/49827; H01L 24/13; H01L 24/16; H01L 24/73
See application file for complete search history.

(56) References Cited

U.S. PATENT DOCUMENTS 6,517,359 B1 * 2/2003 Felps ................. H01R 13/2421
439/246
8,076,177 B2 12/2011 Chen et al.
(Continued)

*Primary Examiner* — Brian Turner
(74) *Attorney, Agent, or Firm* — Foley & Lardner LLP; Cliff Z. Liu

(57) ABSTRACT

A semiconductor package device comprises a first dielectric layer, a first conductive pad and a first conductive element. The first dielectric layer has a first surface and a second surface opposite to the first surface. The first dielectric layer defines a first opening tapered from the first surface toward the second surface. The first conductive pad is within the first opening and adjacent to the second surface of the first dielectric layer. At least a portion of the first conductive element is within the first opening. The first conductive element is engaged with (e.g., abuts) a sidewall of the first opening, the first conductive element having a first surface facing toward the first conductive pad, wherein the first surface of the first conductive element is spaced apart from the first conductive pad.

32 Claims, 33 Drawing Sheets

(51) Int. Cl.
*H01L 25/00* (2006.01)
*B23K 3/06* (2006.01)

(56) References Cited

U.S. PATENT DOCUMENTS

| 2004/0197952 | A1* | 10/2004 | Lee | H01L 23/13 |
| | | | | 438/107 |
| 2008/0023829 | A1* | 1/2008 | Kok | H01L 24/81 |
| | | | | 257/737 |
| 2016/0240503 | A1* | 8/2016 | Shu | H01L 23/3142 |

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including a flip-chip bonding structure and a method of manufacturing the same.

2. Description of the Related Art

In a semiconductor package device, a die or a chip can be attached to a substrate by flip-chip bonding technique. For example, during a clip-chip bonding process for mounting a die to a substrate (e.g., a circuit board or another chip), the die is flipped over so that conductive pillars of the die are aligned with corresponding conductive pads of the substrate. However, a relatively rough surface of a conductive pad of the substrate or inaccuracy of a bonder or bonding equipment may result in a shift or misalignment between the conductive pad of the substrate and a conductive pillar of the die. The shift or misalignment may adversely affect a connection structure (e.g. a solder material or a solder ball) disposed between the conductive pad and the conductive pillar and lead to reliability issues such as an open circuit between the die and the substrate.

SUMMARY

In one or more embodiments, a semiconductor package device comprises a first dielectric layer, a first conductive pad and a first conductive element. The first dielectric layer has a first surface and a second surface opposite to the first surface. The first dielectric layer defines a first opening tapered from the first surface facing toward the second surface. The first conductive pad is within the first opening and adjacent to the second surface of the first dielectric layer. At least a portion of the first conductive element is within the first opening. The first conductive element is engaged with (e.g., abuts) a sidewall of the first opening, the first conductive element having a first surface facing toward the first conductive pad, wherein the first surface of the first conductive element is spaced apart from the first conductive pad.

In one or more embodiments, a semiconductor package device comprises a dielectric layer, a conductive pad, a conductive pillar and a first includes intermetallic compounds (IMC) layer. The dielectric layer has a first surface and a second surface opposite to the first surface. The dielectric layer defines an opening tapered from the surface facing toward the second surface. The conductive pad is within the opening and adjacent to the second surface of the dielectric layer. At least a portion of the conductive pillar is within the opening and the conductive pillar has a first surface facing toward the conductive pad. The first IMC layer is on the first surface of the conductive pillar and extending from the first surface of the conductive pillar into the conductive pillar. The first IMC layer is engaged with (e.g., abuts) a sidewall of the opening.

In one or more embodiments, a semiconductor package device comprises a dielectric layer, a conductive pad, a conductive pillar and a first IMC layer. The dielectric layer has a first surface and a second surface opposite to the first surface. The dielectric layer defines an opening tapered from the first surface facing toward the second surface. The conductive pad is within the opening and adjacent to the second surface of the dielectric layer. At least a part of the conductive pillar is within the opening. The conductive pillar has a first portion and a second portion on the first portion. A width of the first portion of the conductive pillar is less than a width of the second portion of the conductive pillar. The first IMC layer covers the first portion of the conductive pillar.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
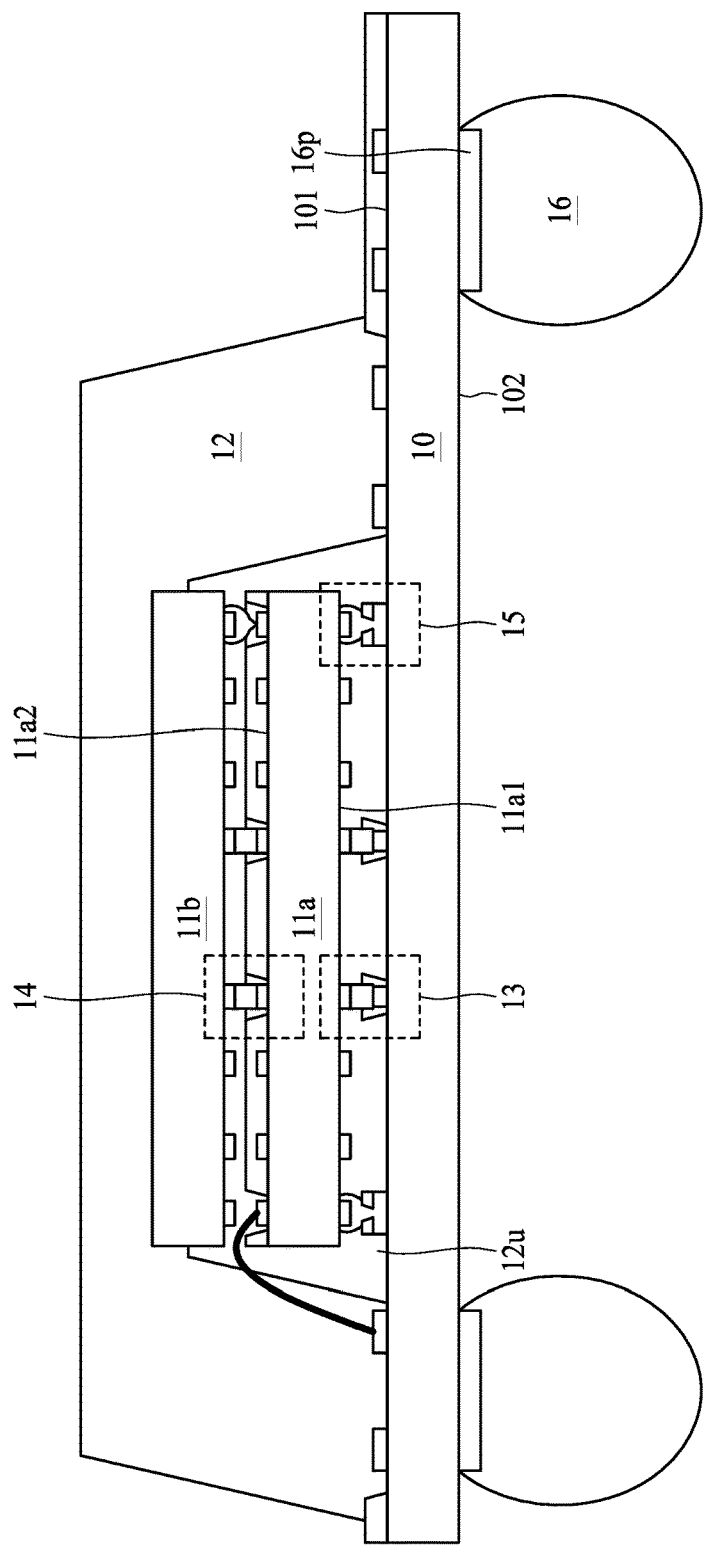
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes a carrier 10, electronic components 11a, 11b, a package body 12, underfill 12u and connection structures 13, 14 and 15.

The carrier 10 may be, for example, a printed circuit board, such as a paper-based copper foil laminate, a composite copper foil laminate, a polymer-impregnated glass-fiber-based copper foil laminate, or a combination of two or more thereof. The carrier 10 may include an interconnection structure, such as a redistribution layer (RDL). In some embodiments, the surface 101 of the carrier 10 is referred to as a top surface or a first surface, and the surface 102 of the carrier 10 is referred to as a bottom surface or a second surface. The carrier 10 may include one or more conductive pads 16p on its bottom surface 102. One or more electrical contacts 16 are disposed on the conductive pads 16p of the carrier 10. In some embodiments, a thickness of the conductive pad 16p is less than a thickness of the conductive pad 10p as shown in FIGS. 1B-1F. In some embodiments, the electrical contacts 16 are Controlled Collapse Chip Connection (C4) bumps, Ball Grid Array (BGA) or Land Grid Array (LGA).

The electronic component 11a is disposed on the top surface 101 of the carrier 10 and electrically connected to the carrier 10 through the connection structure 13. The electronic component 11a may be, e.g., a chip or a die including a semiconductor substrate, one or more integrated circuit devices and one or more overlying interconnection structures therein. The integrated circuit devices may include active devices such as transistors and/or passive devices such resistors, capacitors, inductors, or a combination of two or three thereof. In some embodiments, the electronic component 11a is a double-sided electronic component. The surface 11a1 of the electronic component 11a is electrically connected to the carrier 10 through, e.g., flip-chip technique (e.g., through the connection structures 13 and/or 15), while the surface 11a2 of the electronic component 11a is electrically connected to the carrier 10 through, e.g., wire bonding technique.

The electronic component 11b is disposed on the surface 11a2 of the electronic component 11a and electrically connected to the electronic component 11a through the connection structure 14. The electronic component 11b may be, e.g., a chip or a die including a semiconductor substrate, one or more integrated circuit devices and one or more overlying interconnection structures therein. The integrated circuit devices may include active devices such as transistors and/or passive devices such resistors, capacitors, inductors, or a combination or two or more thereof. In some embodiments, the area of the electronic component 11b may be larger than, substantially equal to or smaller than the area of the electronic component 11a, depending on design specifications. In some embodiments, the electronic component 11b is a single-sided electronic component. Alternatively, the electronic component 11b may be a double-sided electronic component, depending on design specifications. In some embodiments, the electronic component 11b is not required, depending on design specifications. For example, the semiconductor package device 1 may include one electronic component 11a. In some embodiments, at least one electronic component can be stacked on the electronic component 11b. The number of the stacked electronic components may vary depending on different embodiments.

The underfill 12u may be disposed on the top surface 101 of the carrier 10 to cover the active surfaces (e.g., surfaces adjacent to connection structures 13 or 14) of the electronic components 11a and 11b and the connection structures 13 and 14. In some embodiments, the underfill 12u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 12u may be capillary underfill (CUF) or molded underfill (MUF) depending on different embodiments.

The package body 12 is disposed on the top surface 101 of the carrier 10 and covers at least a portion of the electronic component 11b and the underfill 12u. In some embodiments, the package body 12 includes, for example, organic materials (e.g., molding compound, bismaleimide triazine (BT), polyimide (PI), polybenzoxazole (PBO), solder resist, Ajinomoto build-up film (ABF), polypropylene (PP), epoxy-based material, or a combination of two or more thereof), inorganic materials (e.g., silicon, glass, ceramic, quartz, or a combination of two or more thereof), liquid, dry-film materials, or a combination of two or more thereof.

Figure 1B:
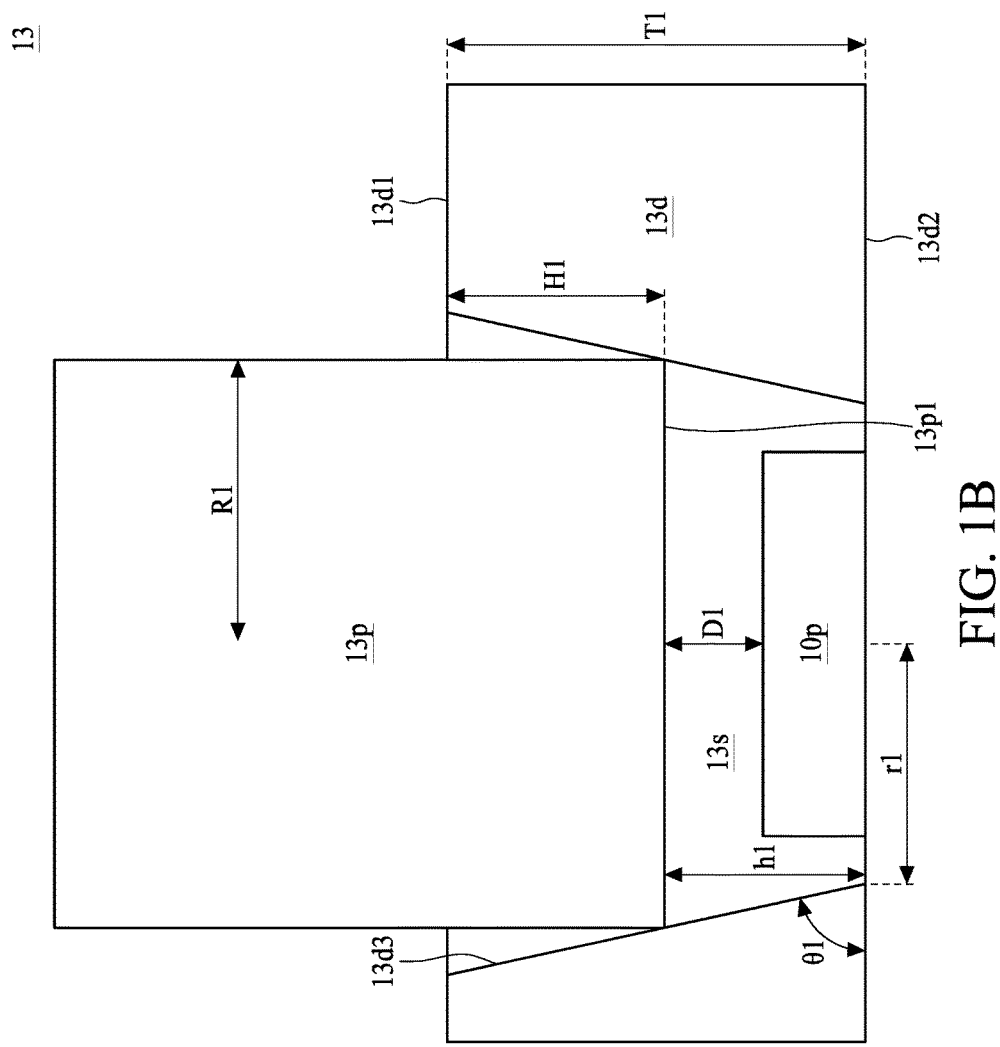
FIG. 1B illustrates an enlarged view of a connection structure of the semiconductor package device in FIG. 1A in accordance with some embodiments of the present disclosure.

FIG. 1B illustrates an enlarged view of the connection structure 13 of the semiconductor package device 1 of FIG. 1A, in accordance with some embodiments of the present disclosure. The connection structure 13 includes a dielectric layer 13d, a solder layer 13s and a conductive pillar 13p (also referred to as conductive element).

The dielectric layer 13d is disposed on the top surface 101 of the carrier 10 as shown in FIG. 1A. The dielectric layer 13d has a first surface 13d1 and a second surface 13d2 facing toward the top surface 101 of the carrier 10. The dielectric layer 13d defines an opening tapered from the first surface 13d1 facing toward the second surface 13d2 to expose a conductive pad 10p on the top surface 101 of the carrier 10. In some embodiments, the dielectric layer 13d may include organic, solder mask, PI, epoxy, ABF, molding compound, or a combination of two or more thereof.

At least a portion of the conductive pillar 13p is disposed within the opening of the dielectric layer 13d and engaged with (e.g., abut) the sidewall 13d3 of the opening. For example, the corners or edges of the conductive pillar 13p contact sidewall 13d3 of the opening. The conductive pillar 13p has a surface 13p1 facing toward the conductive pad 10p. The surface 13p1 of the conductive pillar 13p is spaced apart from the conductive pad 10p in a distance D1. In some embodiments, the conductive pillar 13p includes gold (Au), silver (Ag), copper (Cu), platinum (Pt), titanium (Ti), tungsten (Wu), nickel (Ni), other suitable metals, or an alloy or a combination of two or more thereof. In some embodiments, the surface 13p1 of the conductive pillar 13p may be circle-shaped, square-shaped, rectangle-shaped, triangle-shaped or scalene-shaped.

According to at least some embodiments of the present disclosure, by disposing the conductive pillar 13p into the tapered opening to engage to the sidewall 13d3 of the opening of the dielectric layer 13d, the accuracy of the alignment between the conductive pad 10p and the conductive pillar 13p can be improved. In addition, the connection strength between the conductive pad 10p and the conductive pillar 13p can be increased as well.

The solder layer 13s is disposed within the opening and fills a space enclosed by the conductive pillar 13p, the conductive pad 10p, and the sidewall(s) of the opening. For example, the solder layer 13s covers the conductive pad 10p, the surface 13p1 of the conductive pillar 13p and a portion of the lateral surface(s) of the conductive pillar 13p that is within the opening. In some embodiments, a melting point of the solder layer 13a is greater than a melting point of the electrical contacts 16.

In some embodiments, to ensure that the conductive pillar 13p can be properly engaged with the sidewall of the opening, the following inequality may be satisfied:

$$\pi R1^2 \times H1 \geq \frac{1}{3}\pi \times h1 \times (R1^2 + r1^2 + R1r1), \quad \text{Eq. (1)}$$

wherein R1 is a radius of the conductive pillar 13p, r1 is a radius of the bottom portion of the opening (e.g., adjacent to the second surface 13d2 of the dielectric layer 13d), H1 is a thickness of the conductive pillar 13p that is covered by the solder layer 13s, and h1 is a distance between the surface 13p1 of the conductive pillar 13p and the bottom portion of the opening as shown in FIG. 1B. In addition, h1 may be less than the thickness T1 of the dielectric layer, and thus the following inequality may be satisfied:

$$0 \leq 0.5 \times (R1-r1)\tan\theta1 \leq T1 \quad \text{Eq. (2)},$$

wherein θ1 is an acute angle defined by the second surface 13d2 of the dielectric layer 13d and the sidewall 13d3 of the opening. Therefore, the condition of H1 can be derived through a combination of Eq. (1) and Eq. (2):

$$H1 \geq \frac{(R1-r1)(R1^2 + r1^2 + R1r1)\tan\theta1}{6R^2}$$

In some embodiments, θ1 is in a range from 0 degree to about 90 degrees, from 0 degree to about 100 degrees, from 0 degree to about 120 degrees; r1 is in a range from about 5 micrometer (μm) to about 50 μm, from about 2 μm to about 70 μm, from about 1 μm to about 100 μm; R1 is in a range from about 10 μm to about 100 μm, from about 5 μm to about 200 μm, from about 1 μm to about 500 μm; T1 is in a range from about 2 μm to about 50 μm, from about 1 μm to about 100 μm, from about 0.5 μm to about 200 μm. Therefore, it can be derived from the above condition that H1 may be in a range, e.g., from about 1 μm to about 100 μm, from about 0.5 μm to about 200 μm, from about 0.1 μm to about 500 μm.

Figure 1C:
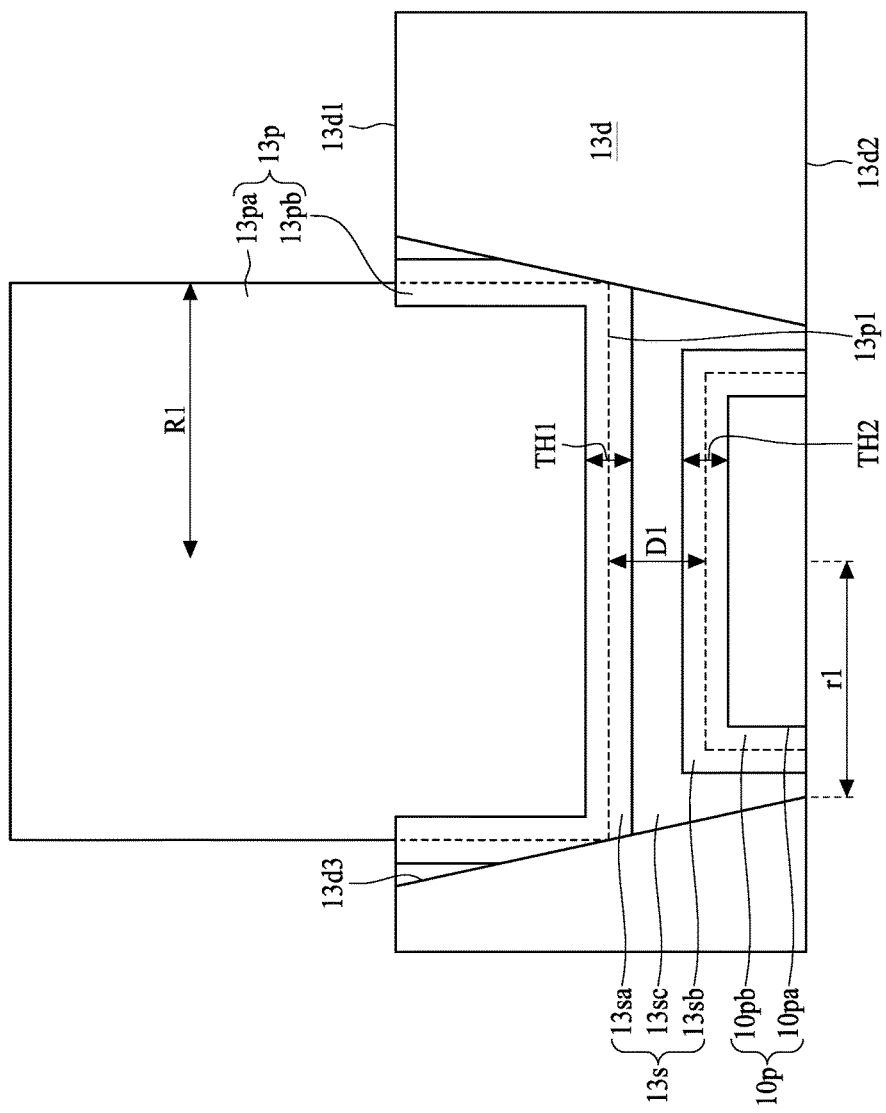
FIG. 1C illustrates an enlarged view of a connection structure of the semiconductor package device in FIG. 1A in accordance with some embodiments of the present disclosure.

FIG. 1C illustrates an enlarged view of the connection structure 13 of the semiconductor package device 1 of FIG. 1A, in accordance with some embodiments of the present disclosure. The connection structure 13' in FIG. 1C is similar to the connection structure 13 in FIG. 1B, except that the connection structure 13' in FIG. 1C further includes intermetallic compounds (IMC) layers 10pb, 13sb, 13sa and 13pb.

The IMC layer 10pb is formed at an interface between the conductive pad 10p and the solder layer 13s shown in FIG. 1B and extends into the solder layer 13s and the conductive pad 10p. For example, the conductive pad 10p includes a first portion 10*pa* and a second portion 10*pb*. The first portion 10*pa* of the conductive pad 10*p* includes the same composition as the conductive pad 10*p* while the second portion 10*pb* of the conductive pad 10*p* is an IMC layer. In some embodiments, the second portion 10*pb* of the conductive pad 10*p* covers the first portion 10*pa* of the conductive pad 10*p*.

Similarly, the solder layer 13*s* includes a first portion 13*sa*, a second portion 13*sb* and a third portion 13*sc*. The third portion 13*sc* of the solder layer 13*s* includes the same composition as the solder layer 13*s* while the first portion 13*sa* and the second portion 13*sb* of the solder layers 13*s* are IMC layers.

The IMC layer 13*pb* is formed at an interface between the conductive pillar 13*p* and the solder layer 13*s* shown in FIG. 1B and extends into the solder layer 13*s* and the conductive pillar 13*p*. For example, the conductive pillar 13*p* includes a first portion 13*pa* and a second portion 13*pb*. The first portion 13*pa* of the conductive pillar 13*p* includes the same composition as the conductive pillar 13*p* while the second portion 13*pb* of the conductive pillar 13*p* is an IMC layer. In some embodiments, the second portion 13*pb* of the conductive pillar 13*p* covers the first portion 13*pa* of the conductive pillar 13*p*. The second portion 13*pb* of the conductive pillar 13*p* is engaged with the sidewall 13*d*3 of the dielectric layer 13*d*.

In some embodiments, a distance D1 between the conductive pillar 13*p* and the conductive pad 10*p* is greater than half of a sum of a thickness TH1 and a thickness TH2. As shown in FIG. 1C, TH1 represents the thickness of the IMC layers 13*pb*, 13*sa* formed at the interface between the conductive pillar 13*p* and the solder layer 13*s*, while TH2 represents the thickness of the IMC layers 10*pb*, 13*sb* formed at the interface between the conductive pad 10*p* and the solder layer 13*s*. For example, the distance D1 is greater than ½ (TH1+TH2).

Figure 1D:
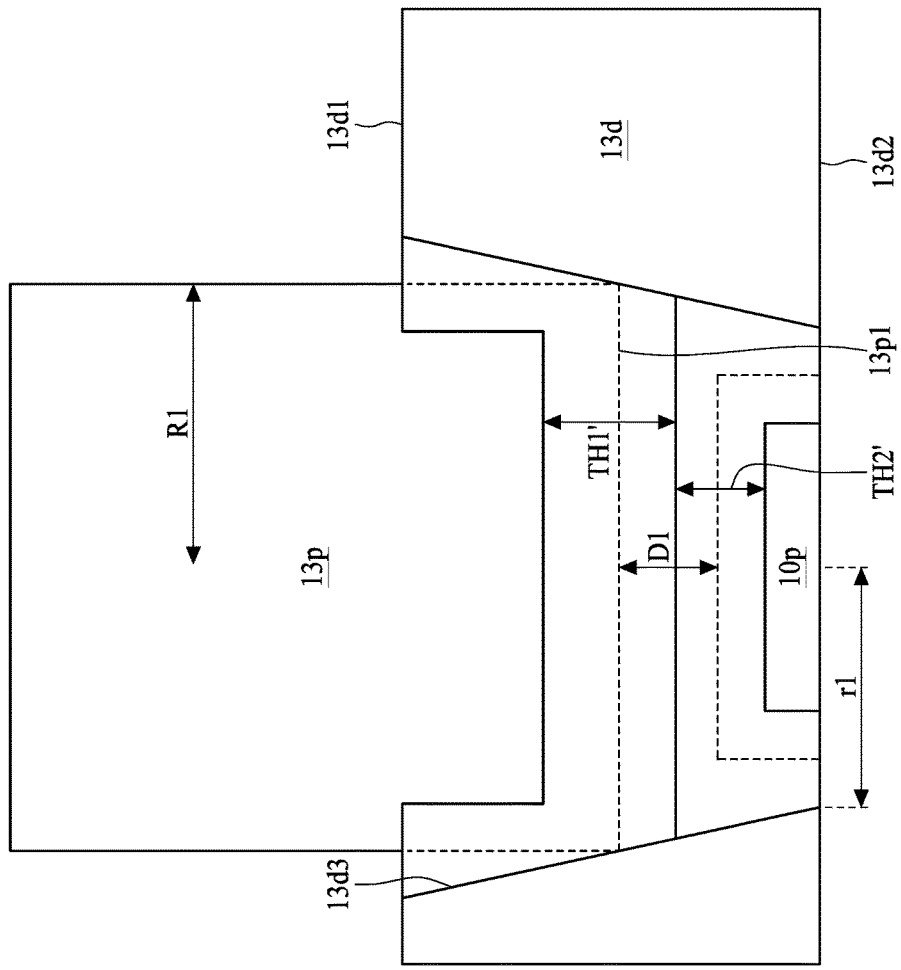
FIG. 1D illustrates an enlarged view of a connection structure of the semiconductor package device in FIG. 1A in accordance with some embodiments of the present disclosure.

FIG. 1D illustrates an enlarged view of the connection structure 13 of the semiconductor package device 1 of FIG. 1A, in accordance with some embodiments of the present disclosure. The connection structure 13" in FIG. 1D is similar to the connection structure 13' in FIG. 1C, except that the solder layer 13*s* shown in FIG. 1C is replaced by one or more IMC layers.

In some embodiments, a distance D1 between the conductive pillar 13*p* and the conductive pad 10*p* substantially equals a half of a sum of a thickness TH1' and a thickness TH2'. As shown in FIG. 1D, TH1' represents the thickness of the IMC layer formed at the interface between the conductive pillar 13*p* and the solder layer 13*s*, while TH2' represents the thickness of the IMC layer formed at the interface between the conductive pad 10*p* and the solder layer 13*s*. In other words, for example, the IMC layer formed at the interface between the conductive pillar 13*p* and the solder layer 13*s* directly contacts the IMC layer formed at the interface between the conductive pad 10*p* and the solder layer 13*s*.

Figure 1E:
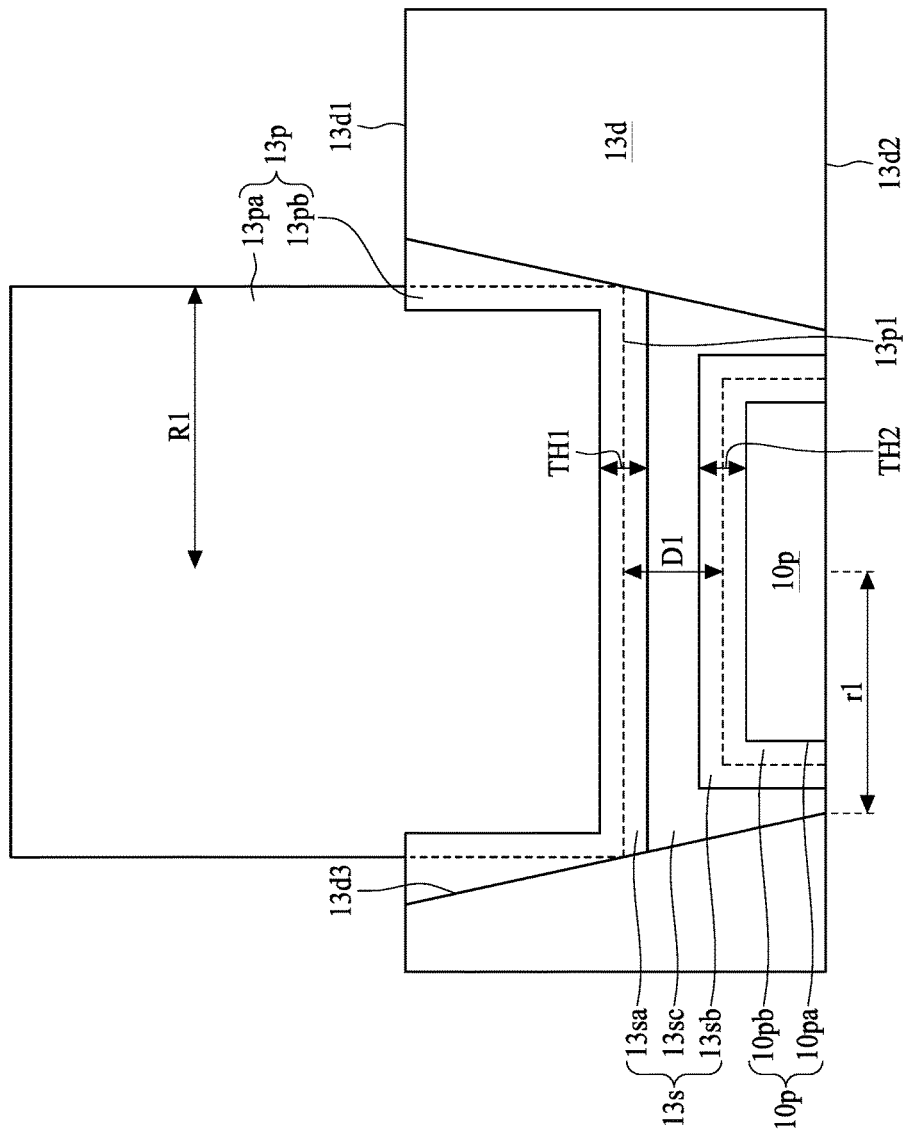
FIG. 1E illustrates an enlarged view of a connection structure of the semiconductor package device in FIG. 1A in accordance with some embodiments of the present disclosure.

FIG. 1E illustrates an enlarged view of the connection structure 13 of the semiconductor package device 1 of FIG. 1A, in accordance with some embodiments of the present disclosure. The connection structure 13''' in FIG. 1E is similar to the connection structure 13' in FIG. 1C, and the difference therebetween is that in FIG. 1C, a portion of the solder layer 13*s* is between the conductive pillar 13*p* and the sidewall 13*d*3 of the dielectric layer 13*d*, while in FIG. 1E, the solder layer between the conductive pillar 13*p* and the sidewall 13*d*3 of the dielectric layer 13*d* is replaced by one or more IMC layers.

Figure 1F:
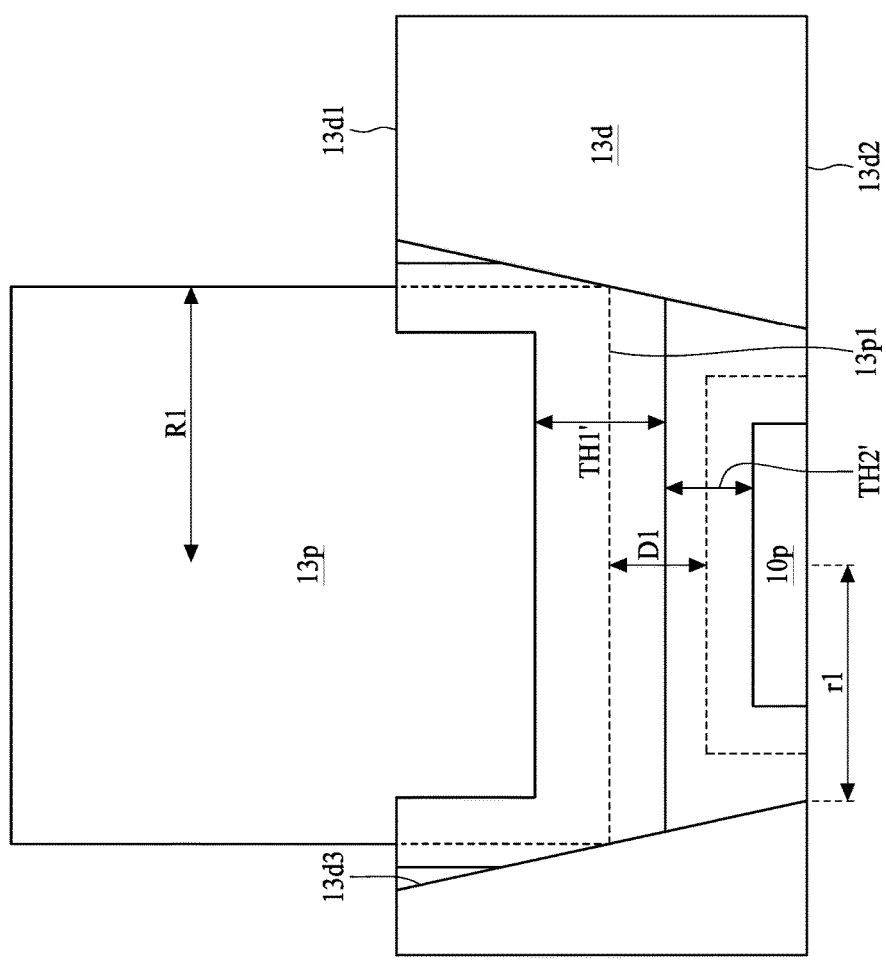
FIG. 1F illustrates an enlarged view of a connection structure of the semiconductor package device in FIG. 1A in accordance with some embodiments of the present disclosure.

FIG. 1F illustrates an enlarged view of the connection structure 13 of the semiconductor package device 1 of FIG. 1A, in accordance with some embodiments of the present disclosure. The connection structure 13"" in FIG. 1F is similar to the connection structure 13' in FIG. 1C, and the difference therebetween is that in FIG. 1C, a portion of the solder layer 13*s* is between the conductive pillar 13*p* and the conductive pad 10*p* while in FIG. 1F, the solder layer between the conductive pillar 13*p* and the conductive pad 10*p* is replaced by one or more IMC layers.

During a reflow process, the solder layer 13*s* as shown in FIG. 1B may react with the conductive pad 10*p* of a bottom die or a substrate to form an intermetallic compounds (IMC) layer or multiple IMC layers (e.g. IMC layers 10*pb*, 13*sb*, 13*sa* and 13*pb*). The solder layer 13*s* may include, but is not limited to, for example, SnAg. The conductive pad 10*p* may include, but is not limited to, for example, Cu. The IMC layer may include, but is not limited to, for example, $(Cu,Ni)_6Sn_5$, $(Cu,Ni)_3Sn_4$, or a combination thereof. Bonding force between the conductive pillar 13*p* and the conductive pad 10*p* may depend on a quantity (e.g., thickness) of the IMC layer (or multiple IMC layers). If the conductive pad 10*p* is too small in thickness, the whole conductive pad 10*p* may form a IMC layer, which is susceptible to stress or tension, and crack may occur in the conductive pad 10*p*. A relatively thick IMC layer between the conductive pillar 13*p* and the conductive pad 10*p* may reduce shear strength due to the nature of the IMC layer (IMC is relatively brittle). Moreover, if the solder layer 13*s* is relatively thin (e.g., less than about 30 um, less than about 20 um, or less than about 10 um), the volume ratio of the IMC layer to the solder layer 13*s* may reach a condition that over the volume ratio exceeds about 80%, about 82%, or about 85%, which may also result in joint crack. The IMC layer (or multiple IMC layers) between the conductive pillar 13*p* and the solder layer 13*s* is controlled to have an appropriate thickness. In addition, the IMC layer (or multiple IMC layers) between the between conductive pad 10*p* and the solder layer 13*s* is controlled to have an appropriate thickness. A relatively thin IMC layer may not provide sufficient bonding force, while a relatively thick IMC layer may be susceptible to crack issue.

In accordance with the embodiments as shown in FIGS. 1C-1F, the distance D1 between conductive pillar 13*p* and the conductive pad 10*p* may be designed to specify that a space between conductive pillar 13*p* and the conductive pad 10*p* is great enough to form a relatively thick IMC layer (or multiple IMC layers) to reinforce the connection structure between the conductive pad 10*p* and the conductive pillar 13*p*.

Figure 1G:
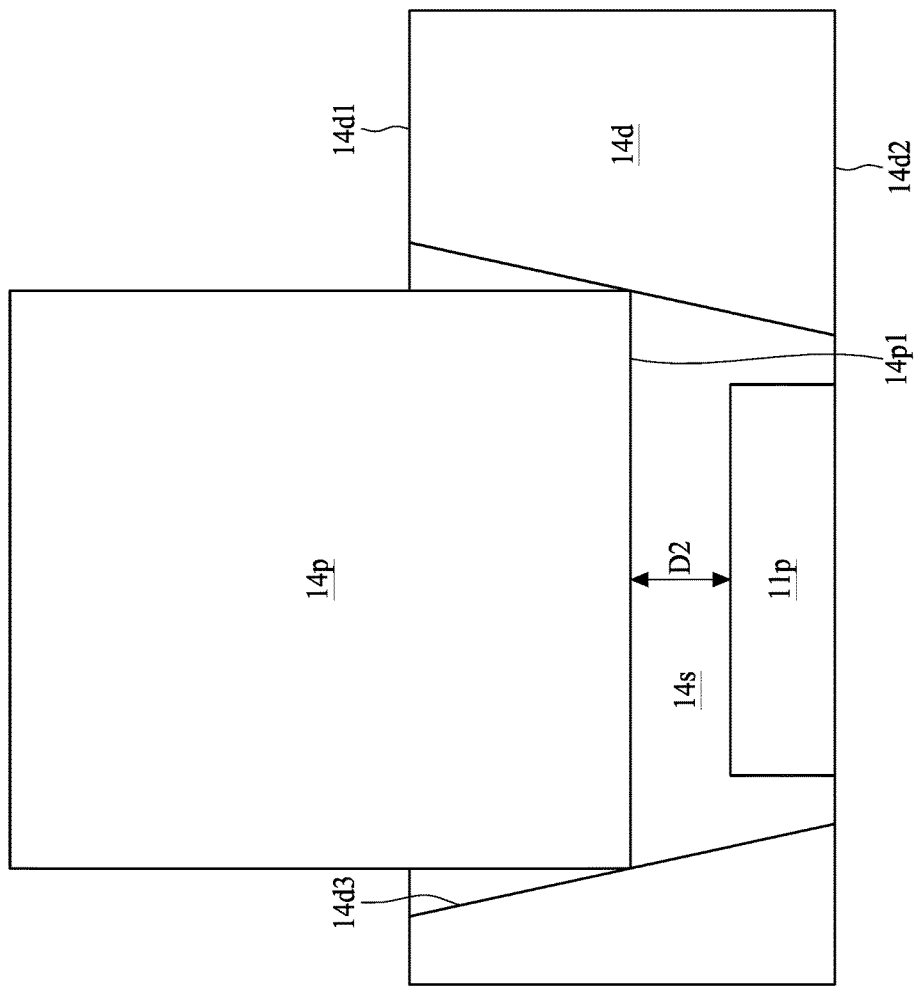
FIG. 1G illustrates an enlarged view of a connection structure of the semiconductor package device in FIG. 1A in accordance with some embodiments of the present disclosure.

FIG. 1G illustrates an enlarged view of the connection structure 14 of the semiconductor package device 1 of FIG. 1A, in accordance with some embodiments of the present disclosure. The connection structure 14 includes a dielectric layer 14*d*, a solder layer 14*s* and a conductive pillar 14*p*.

The dielectric layer 14*d* is disposed on the electronic component 11*a* as shown in FIG. 1A. The dielectric layer 14*d* has a first surface 14*d*1 and a second surface 14*d*2 facing toward the electronic component 11*a*. The dielectric layer 14*d* defines an opening tapered from the first surface 14*d*1 facing toward the second surface 14*d*2 to expose a conductive pad 11*p* on the electronic component 11*a*. In some embodiments, the dielectric layer 14*d* may include organic, solder mask, PI, epoxy, ABF, molding compound, or a combination of two or more thereof. In some embodiments, a thickness of the conductive pad 11*p* is less than a thickness of the conductive pad 10*p* shown in FIGS. 1B-1F and greater than a thickness of the conductive pad 16*p* as shown in FIG.

1A. In some embodiments, a melting point of the solder layer is selected depending on the thickness of the conductive pad.

At least a portion of the conductive pillar 14p is disposed within the opening of the dielectric layer 14d and engaged with (e.g., abut) the sidewall 14d3 of the opening. For example, the corners or edges of the conductive pillar 14p contacts sidewall 14d3 of the opening. The conductive pillar 14p has a surface 14p1 facing toward the conductive pad 11p. The surface 14p1 of the conductive pillar 14p is spaced apart from the conductive pad 11p in a distance D2. In some embodiments, the distance D2 is greater than the distance D2 as shown in FIGS. 1B-1F. In some embodiments, the conductive pillar 14p includes Au, Ag, Cu, Pt, Ti, Wu, Ni, other suitable metals, or an alloy or a combination of two or more thereof. In some embodiments, the surface 14p1 of the conductive pillar 14p may be circle-shaped, square-shaped, rectangle-shaped, triangle-shaped or scalene-shaped.

According to at least some embodiments of the present disclosure, by disposing the conductive pillar 14p into the tapered opening to engage to the sidewall 14d3 of the opening of the dielectric layer 14d, the accuracy of the alignment between the conductive pad 11p and the conductive pillar 14p can be improved. In addition, the connection strength between the conductive pad 11p and the conductive pillar 14p can be increased as well.

The solder layer 14s is disposed within the opening and fills a space enclosed by the conductive pillar 14p, the conductive pad 11p, and the sidewall(s) of the opening. For example, the solder layer 14s covers the conductive pad 11p, the surface 14p1 of the conductive pillar 14p and a portion of the lateral surface(s) of the conductive pillar 14p that is within the opening. In some embodiments, a melting point of the solder layer 14s is less than a melting point of the solder layer 13s shown in FIGS. 1B-1F and greater than a melting point of the electrical contacts 16 shown in FIG. 1A.

Figure 1H:
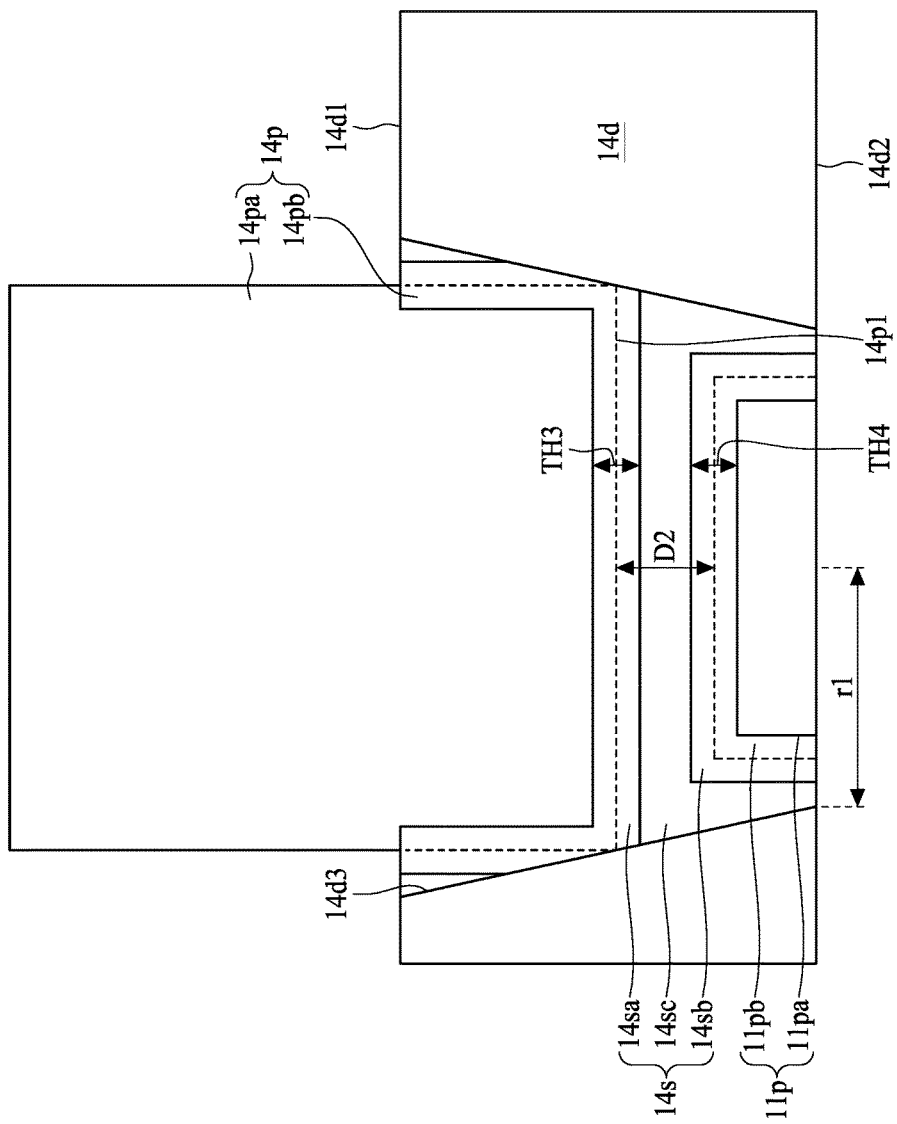
FIG. 1H illustrates an enlarged view of a connection structure of the semiconductor package device in FIG. 1A in accordance with some embodiments of the present disclosure.

FIG. 1H illustrates an enlarged view of the connection structure 14 of the semiconductor package device 1 of FIG. 1A, in accordance with some embodiments of the present disclosure. The connection structure 14' in FIG. 1H is similar to the connection structure 14 in FIG. 1G, except that the connection structure 14' in FIG. 1H further includes IMC layers 11pb, 14sb, 14sa and 14pb.

The IMC layer 11pb is formed at an interface between the conductive pad 11p and the solder layer 14s shown in FIG. 1G and extends into the solder layer 14s and the conductive pad 11p. For example, the conductive pad 11p includes a first portion 11pa and a second portion 11pb. The first portion 11pa of the conductive pad 11p includes the same composition as the conductive pad 11p while the second portion 11pb of the conductive pad 11p is the IMC layer. In some embodiments, the second portion 11pb of the conductive pad 11p covers the first portion 11pa of the conductive pad 11p.

Similarly, the solder layer 14s includes a first portion 14sa, a second portion 14sb and a third portion 14sc. The third portion 14sc of the solder layer 14s includes the same composition as the solder layer 14s while the first portion 14sa and the second portion 14sc of the solder layers 14s are IMC layers.

The IMC layer 14pb is formed at an interface between the conductive pillar 14p and the solder layer 14s shown in FIG. 1B and extends into the solder layer 14s and the conductive pillar 14p. For example, the conductive pillar 14p includes a first portion 14pa and a second portion 14pb. The first portion 14pa of the conductive pillar 14p includes the same composition as the conductive pillar 14p while the second portion 14pb of the conductive pillar 14p is an IMC layer. In some embodiments, the second portion 14pb of the conductive pillar 14p covers the first portion 14pa of the conductive pillar 14p. The second portion 14pb of the conductive pillar 14p is engaged with the sidewall 14d3 of the dielectric layer 14d.

In some embodiments, a distance D2 between the conductive pillar 14p and the conductive pad 11p is greater than a half of a sum of a thickness TH3 and a thickness TH4. As shown in FIG. 1H, TH3 represents the thickness of the IMC layers 14pb, 14sa formed at the interface between the conductive pillar 14p and the solder layer 14s, while TH4 represents the thickness of the IMC layers 11pb, 14sb formed at the interface between the conductive pad 11p and the solder layer 14s. For example, D2 is greater than ½ (TH3+TH4).

Figure 1I:
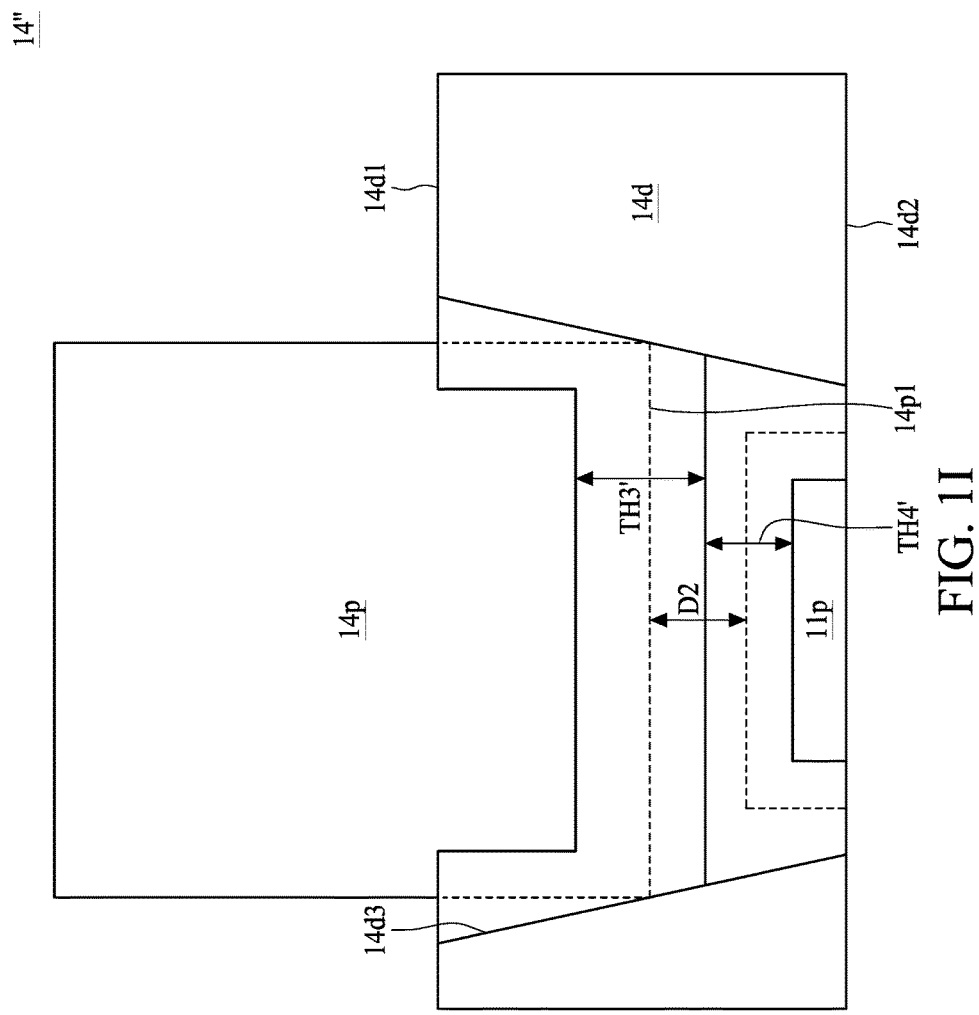
FIG. 1I illustrates an enlarged view of a connection structure of the semiconductor package device in FIG. 1A in accordance with some embodiments of the present disclosure.

FIG. 1I illustrates an enlarged view of the connection structure 14 of the semiconductor package device 1 of FIG. 1A, in accordance with some embodiments of the present disclosure. The connection structure 14'' in FIG. 1I is similar to the connection structure 14' in FIG. 1H, except that the solder layer 14s shown in FIG. 1H is replaced by one or more IMC layers.

In some embodiments, a distance D2 between the conductive pillar 14p and the conductive pad 11p substantially equals a half of a sum of a thickness TH3' and a thickness TH4'. As shown in FIG. 1I, TH3' represents the thickness of the IMC layer formed at the interface between the conductive pillar 14p and the solder layer 14s, while TH4' represents the thickness of the IMC layer formed at the interface between the conductive pad 11p and the solder layer 14s. In other words, for example, the IMC layer formed at the interface between the conductive pillar 14p and the solder layer 14s directly contacts the IMC layer formed at the interface between the conductive pad 11p and the solder layer 14s.

Figure 1J:
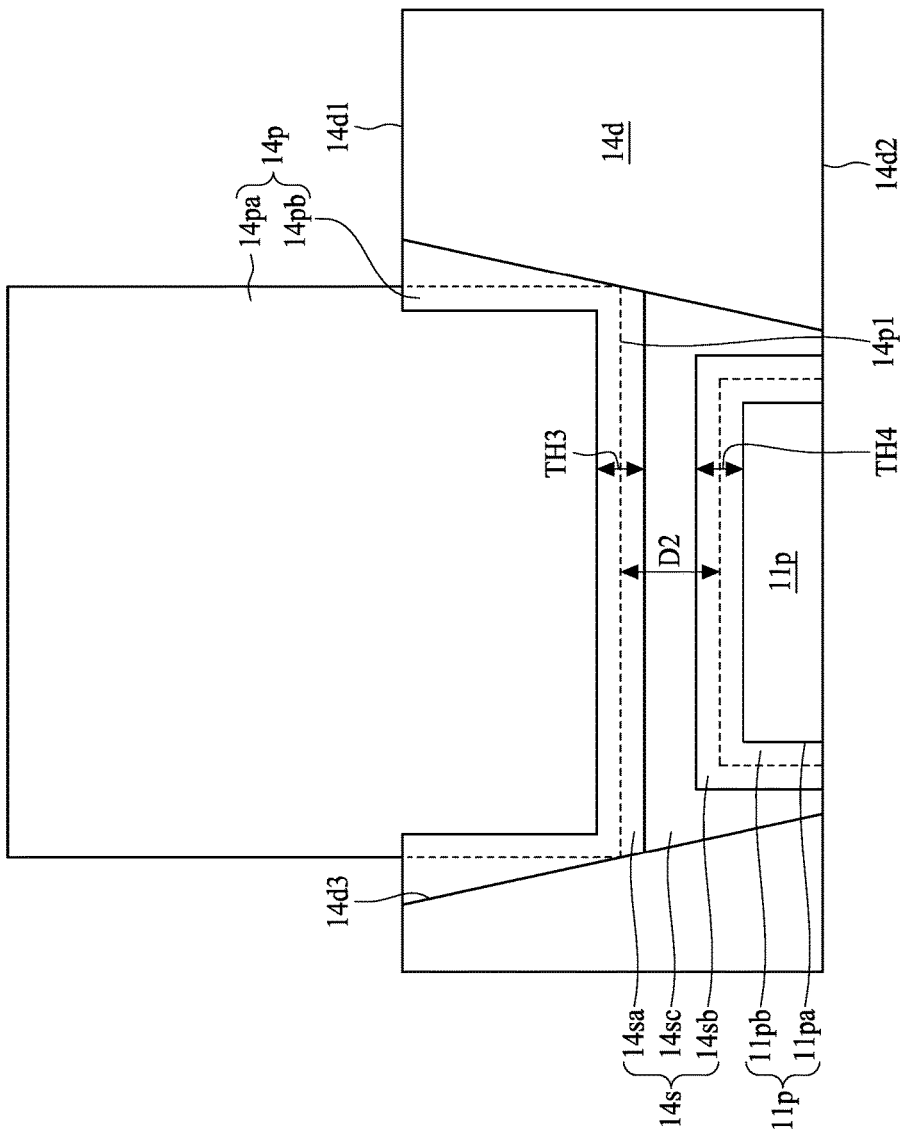
FIG. 1J illustrates an enlarged view of a connection structure of the semiconductor package device in FIG. 1A in accordance with some embodiments of the present disclosure.

FIG. 1J illustrates an enlarged view of the connection structure 14 of the semiconductor package device 1 of FIG. 1A, in accordance with some embodiments of the present disclosure. The connection structure 14''' in FIG. 1J is similar to the connection structure 14' in FIG. 1H, and the difference therebetween is that in FIG. 1H, a portion of the solder layer 14s is between the conductive pillar 14p and the sidewall 14d3 of the dielectric layer 14d while in FIG. 1J, the solder layer between the conductive pillar 14p and the sidewall 14d3 of the dielectric layer 14d is replaced by one or more IMC layers.

Figure 1K:
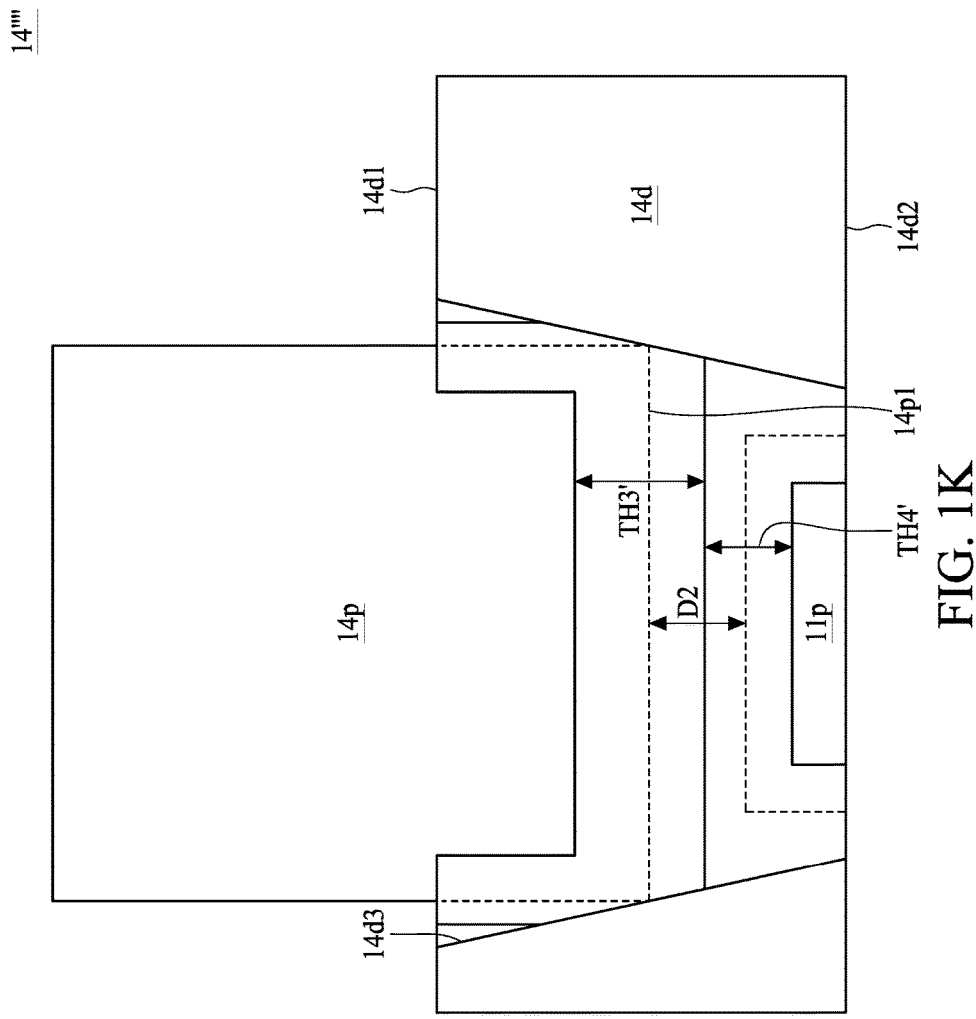
FIG. 1K illustrates an enlarged view of a connection structure of the semiconductor package device in FIG. 1A in accordance with some embodiments of the present disclosure.

FIG. 1K illustrates an enlarged view of the connection structure 14 of the semiconductor package device 1 of FIG. 1A, in accordance with some embodiments of the present disclosure. The connection structure 14'''' in FIG. 1K is similar to the connection structure 14' in FIG. 1H, and the difference therebetween is that in FIG. 1H, a portion of the solder layer 14s is between the conductive pillar 14p and the conductive pad 11p while in FIG. 1K, the solder layer between the conductive pillar 14p and the conductive pad 11p is replaced by one or more IMC layers.

In accordance with the embodiments as shown in FIGS. 1H-1K, the distance D2 between conductive pillar 14p and the conductive pad 11p may be designed to specify that a space between conductive pillar 14p and the conductive pad 11p is great enough to form a relatively thick IMC layer (or multiple IMC layers) to reinforce the connection structure between the conductive pad 11p and the conductive pillar 14p.

Figure 1L:
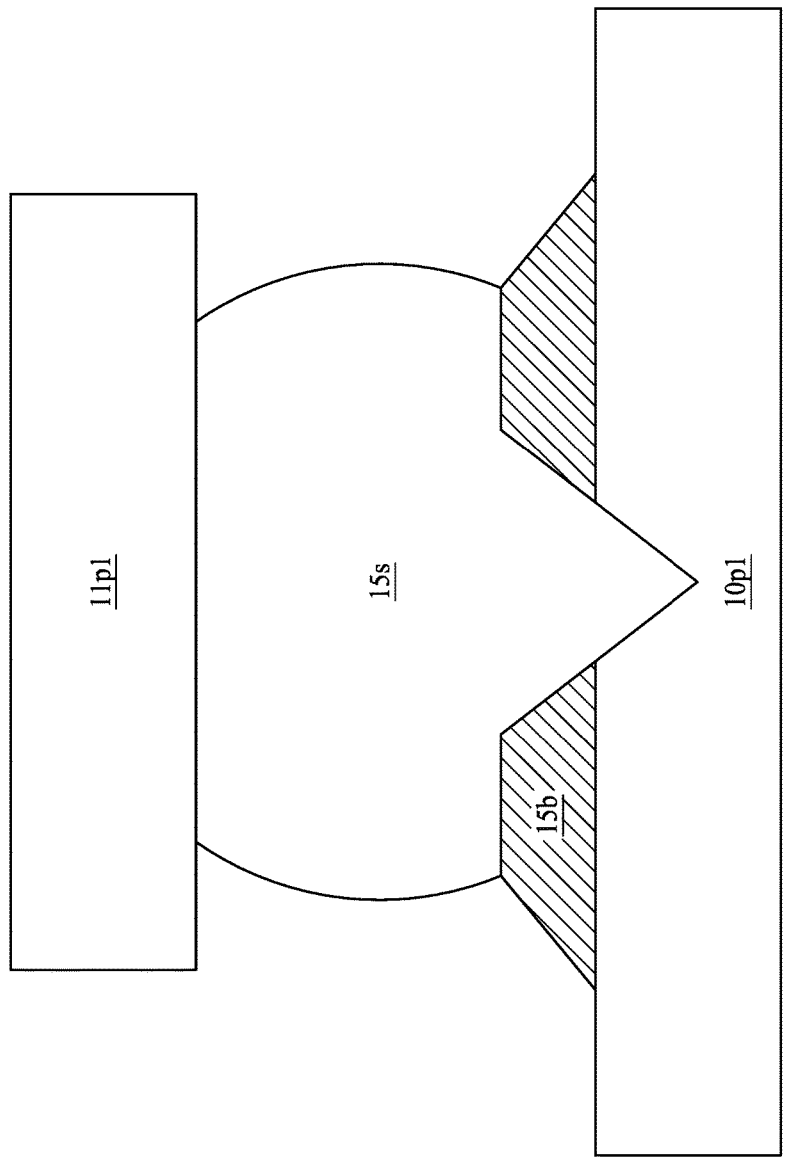
FIG. 1L illustrates an enlarged view of a connection structure of the semiconductor package device in FIG. 1A in accordance with some embodiments of the present disclosure.

FIG. 1L illustrates an enlarged view of the connection structure 15 of the semiconductor package device 1 of FIG. 1A, in accordance with some embodiments of the present disclosure. The connection structure 15 includes a stub bump 15s and a solder layer 15b between the conductive pad 10p1 on top surface 101 of the carrier 10 and the conductive pad 11p1 of the electronic component 11a.

Figure 1M:
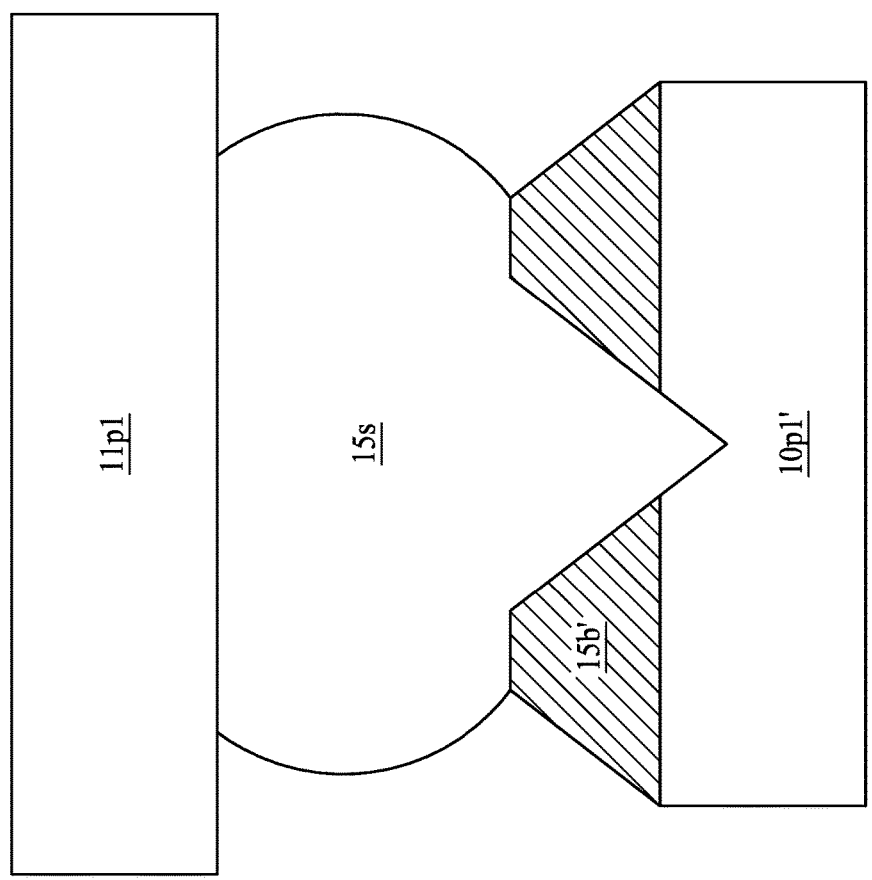
FIG. 1M illustrates an enlarged view of a connection structure of the semiconductor package device in FIG. 1A in accordance with some embodiments of the present disclosure.
Figure 1N:
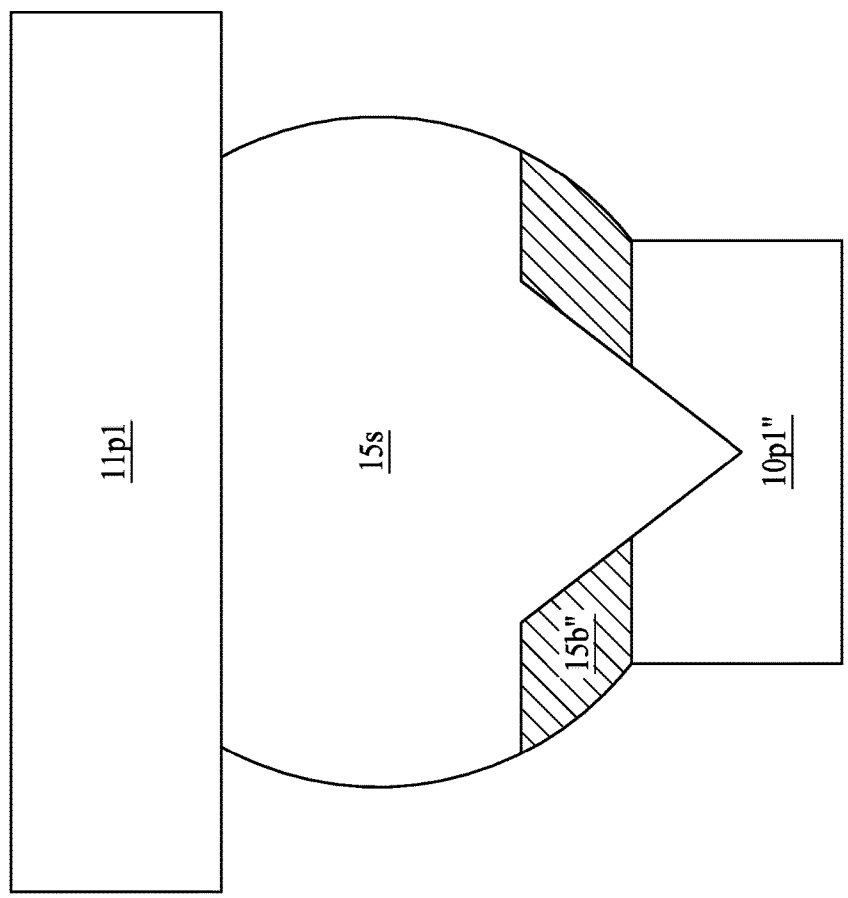
FIG. 1N illustrates an enlarged view of a connection structure of the semiconductor package device in FIG. 1A in accordance with some embodiments of the present disclosure.

In some embodiments, the connection structure 15 is disposed around one or more edges of the electronic component 11a as shown in FIG. 1A. Referring back to FIG. 1L, a portion of the stub bump 15s is inserted into the conductive pad 10p1 to improve the alignment between the conductive pad 10p1 and the conductive pad 11p1 and to prevent a lateral movement of the electronic component 11a. As shown in FIG. 1L, a width of the stub bump 15s is less than a width of the conductive pads 10p1. Alternatively, the width of the stub bump 15s can be substantially equal to (as shown in FIG. 1M) or greater than (as shown in FIG. 1N) a width of the conductive pads 10p1', 10p1". As shown in FIGS. 1L, 1M and 1N, the shape of the solder layer may vary depending on the relative differences between widths of the stub bump and the conductive pad.

Figure 2:
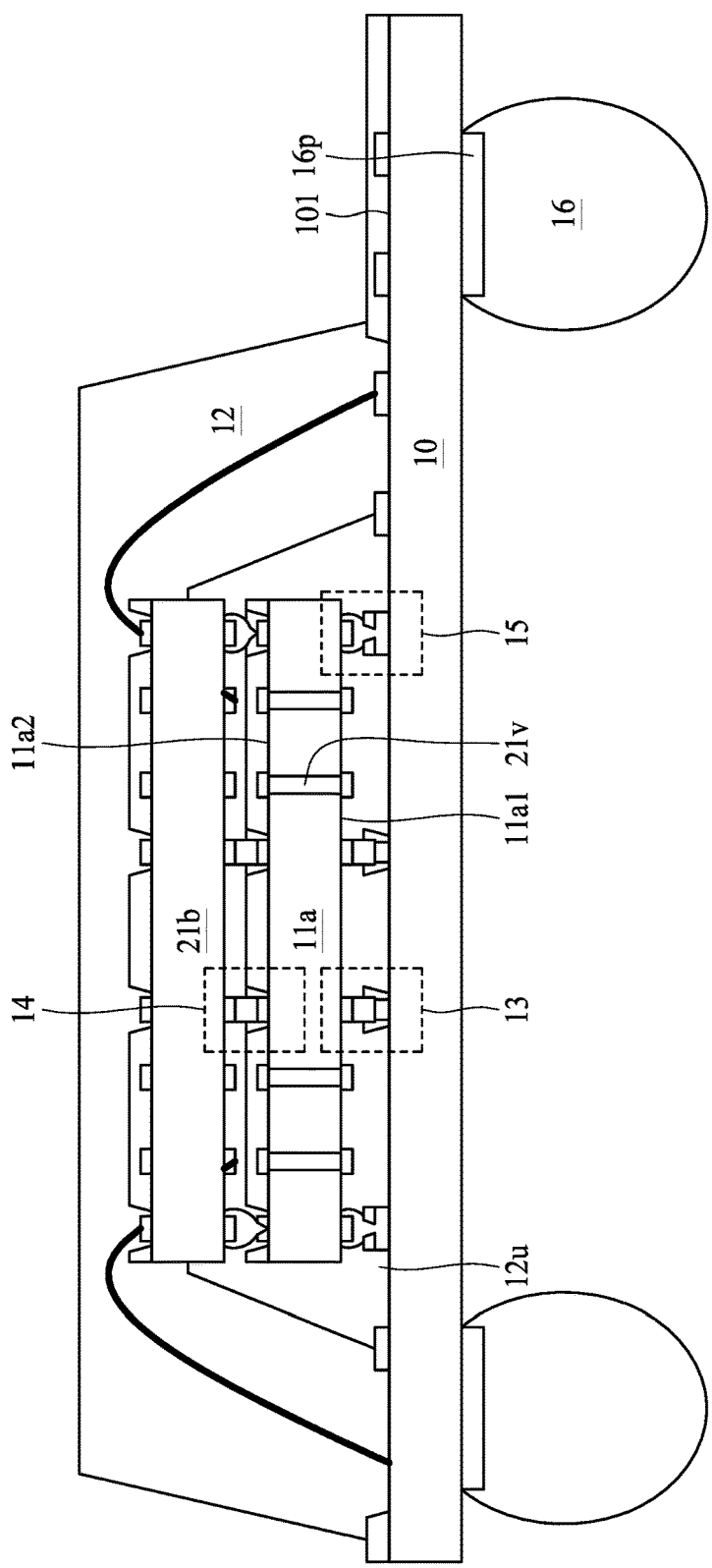
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to semiconductor package device 1 shown in FIG. 1A, except that the electronic component 21b is a double-sided chip or die and that the surfaces 11a1 and 11a2 of the electronic component 11a are electrically connected by through vias 21v.

Figure 3:
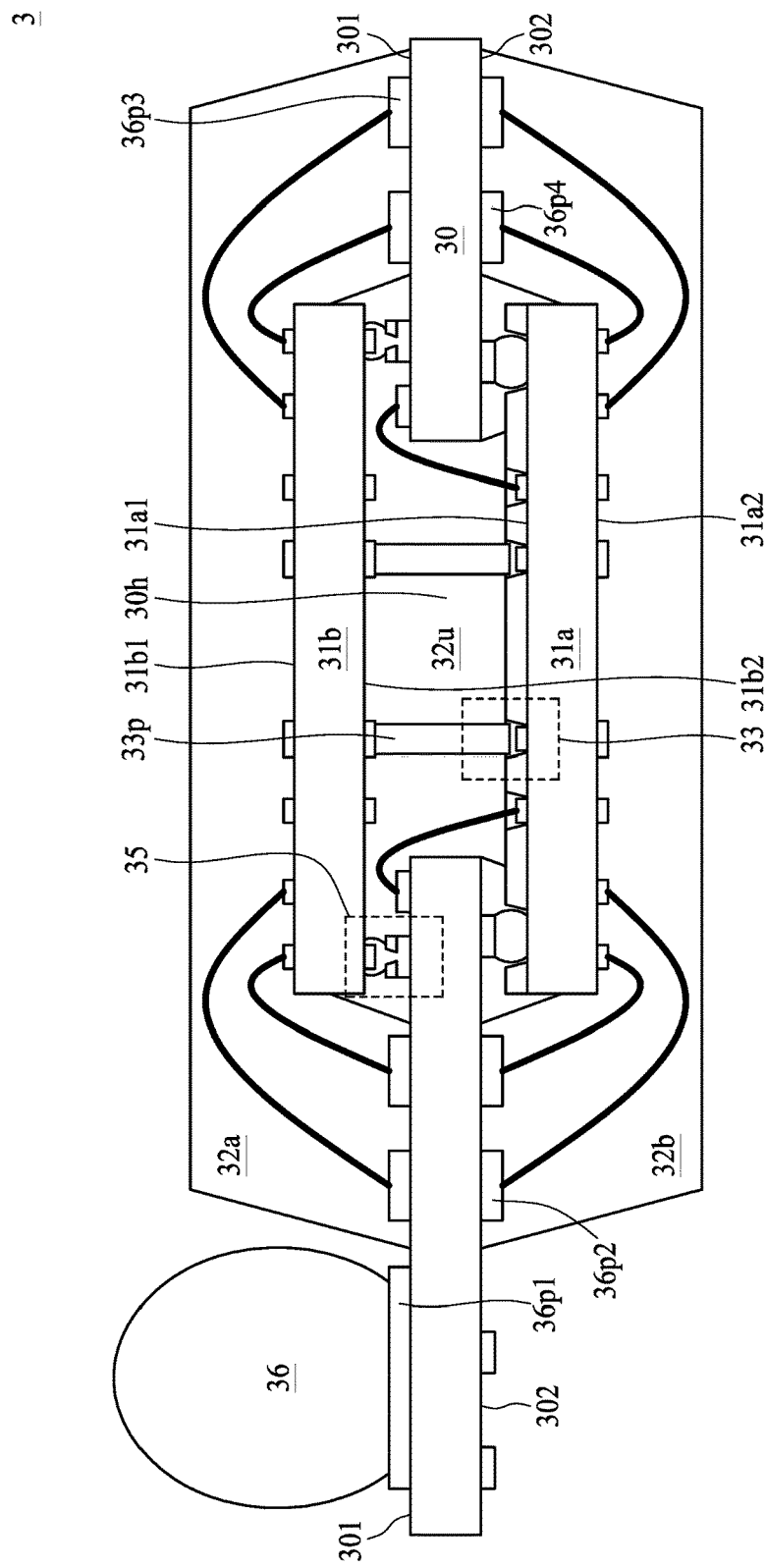
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 includes a carrier 30, electronic components 31a, 31b, package bodies 32a, 32b, underfill 32u and connection structures 33, 35.

The carrier 30 may be, for example, a printed circuit board, such as a paper-based copper foil laminate, a composite copper foil laminate, a polymer-impregnated glass-fiber-based copper foil laminate, or a combination of two or more thereof. The carrier 30 may include an interconnection structure, such as a RDL. The carrier 30 defines an opening 30h penetrating the carrier 30. In some embodiments, the surface 301 of the carrier 30 is referred to as a top surface or a first surface, and the surface 302 of the carrier 30 is referred to as a bottom surface or a second surface. The carrier 30 may include multiple conductive pads 36p1, 36p3 on the first surface 301 and conductive pads 36p2, 36p4 on the second surface 302. Electrical contacts 36 are disposed on the conductive pads 36p1 of the carrier 30. In some embodiments, the electrical contacts 36 are C4 bumps, BGA or LGA.

The electronic component 31a is disposed on the second surface 302 of the carrier 30 and across the opening 30h of the carrier 30. The electronic component 31a may be, e.g., a chip or a die including a semiconductor substrate, one or more integrated circuit devices and one or more overlying interconnection structures therein. The integrated circuit devices may include active devices such as transistors and/or passive devices such resistors, capacitors, inductors, or a combination of two or more thereof. In some embodiments, the electronic component 31a is a double-sided electronic component. The surface 31a1 of the electronic component 31a is electrically connected to the second surface 302 of the carrier 30 through, e.g., flip-chip technique and electrically connected the first surface 301 of the carrier 30 through, e.g., wire bonding technique. The surface 31a2 of the electronic component 31a is electrically connected to the second surface 302 of the carrier 30 through, e.g., wire bonding technique.

The electronic component 31b is disposed on the first surface 301 of the carrier 30 and across the opening 30h of the carrier 30. The electronic component 31b has a surface 31b1 and a surface 31b2 facing toward the surface 31a1 of the electronic component 31a. In some embodiments, the electronic component 31b is a double-sided electronic component. The surface 31b2 of the electronic component 31b is electrically connected to the first surface 301 of the carrier 30 through, e.g., flip-chip technique (e.g., through the connection structure 35), while the surface 31b1 of the electronic component 31b is electrically connected to the first surface 301 of the carrier 30 through, e.g., wire bonding technique. In some embodiments, the connection structure 35 is the same as, or similar to the connection structure 15 shown in FIG. 1L. In some embodiments, the surface 31b2 of the electronic component 31b is electrically connected to the surface 31a1 of the electronic component 31a through conductive pillars 33p (which passes through the opening 30h of the carrier 30) and the connection structure 33. In some embodiments, the connection structure 33 is the same as, or similar to any of the connection structures 13, 13', 13", 13'" and 13"" shown in FIGS. 1B-1F. Alternatively, the connection structure 33 can be any suitable connection structure.

The electronic component 31b may be, e.g., a chip or a die including a semiconductor substrate, one or more integrated circuit devices and one or more overlying interconnection structures therein. The integrated circuit devices may include active devices such as transistors and/or passive devices such resistors, capacitors, inductors, or a combination of two or more thereof.

The underfill 32u may be disposed between the electronic components 31a and 31b to cover the surface 31a1 of the electronic component 31a, the surface 31b2 of the electronic component 31b and at least a portion of the first surface 301 and the second surface 302 of the carrier 30. In some embodiments, the underfill 32u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 32u may be CUF or MUF depending on different embodiments.

The package body 32a covers the surface 31b1 of the electronic component 31b, a portion of the first surface 301 of the carrier 30 and a portion of the underfill 32u. The package body 32b covers the surface 31a2 of the electronic component 31a, a portion of the second surface 302 of the carrier 30 and a portion of the underfill 32u. In some embodiments, the package bodies 32a, 32b include, for example, organic materials (e.g., molding compound, BT, PI, PBO, ABF, PP, epoxy-based material, or a combination of two or more thereof), inorganic materials (e.g., silicon, glass, ceramic, quartz, or a combination of two or more thereof), liquid and/or dry-film materials, or a combination of two or more thereof.

FIGS. 4A, 4B, 4C, 4D, 4E, 4F and 4G are cross-sectional views of a semiconductor structure fabricated at various stages, in accordance with some embodiments of the present disclosure. Various figures have been simplified for a better understanding of the aspects of the present disclosure.

Figure 4A:
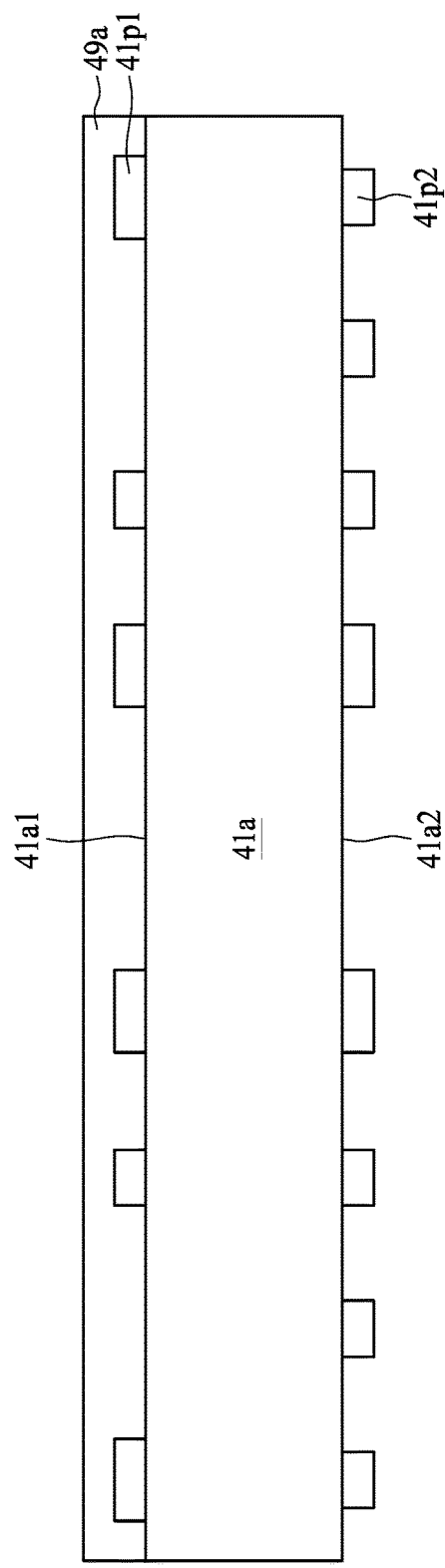
FIG. 4A illustrates one or more stages of a method of manufacturing a semiconductor package device in accordance with some embodiments of the present disclosure.

Referring to FIG. 4A, an electronic component 41a (e.g., chip, die or wafer) is provided. The electronic component 41a is double-sided and has a surface 41a1 and a surface 41a2 opposite to the surface 41a1. The electronic component 41a has a plurality of conductive pads 41p1 on its surface 41a1 and conductive pads 41p2 on its surface 41a2.

A passivation layer 49a (or dielectric layer) is formed on the surface 41a1 of the electronic component 41a to cover the conductive pads 41p1 on the surface 41a1 of the electronic component 41a.

Figure 4B:
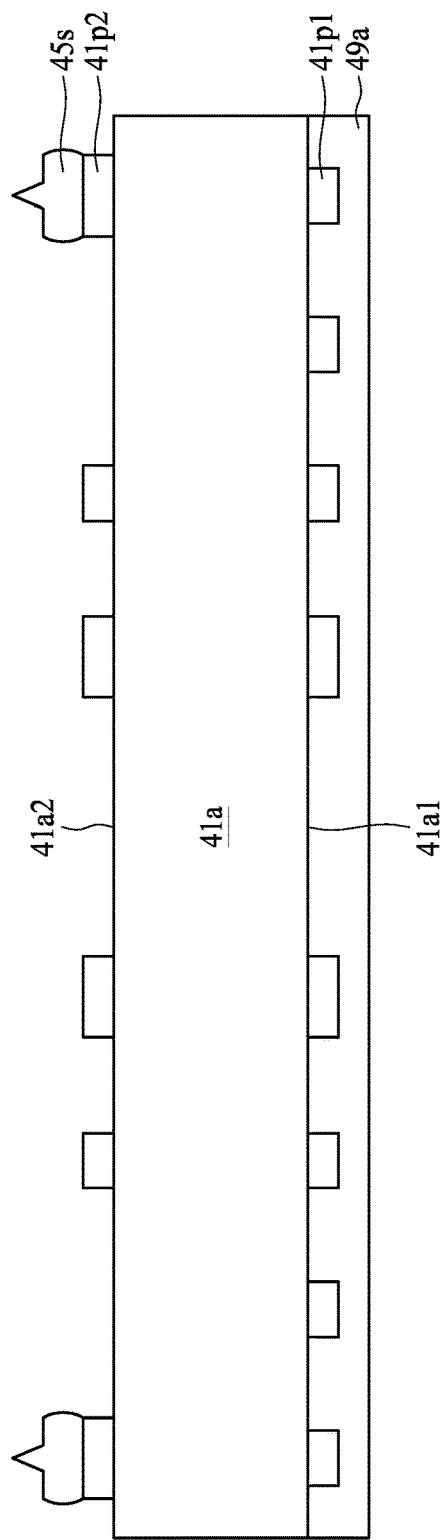
FIG. 4B illustrates one or more stages of a method of manufacturing a semiconductor package device in accordance with some embodiments of the present disclosure.

Referring to FIG. 4B, the structure shown in FIG. 4A is flipped and a stub bump 45s is formed on a portion of the conductive pads 41p2 on the surface 41a2 of the electronic component 41a. In some embodiments, the stub bump 45s is a melted bonding wire.

Figure 4C:
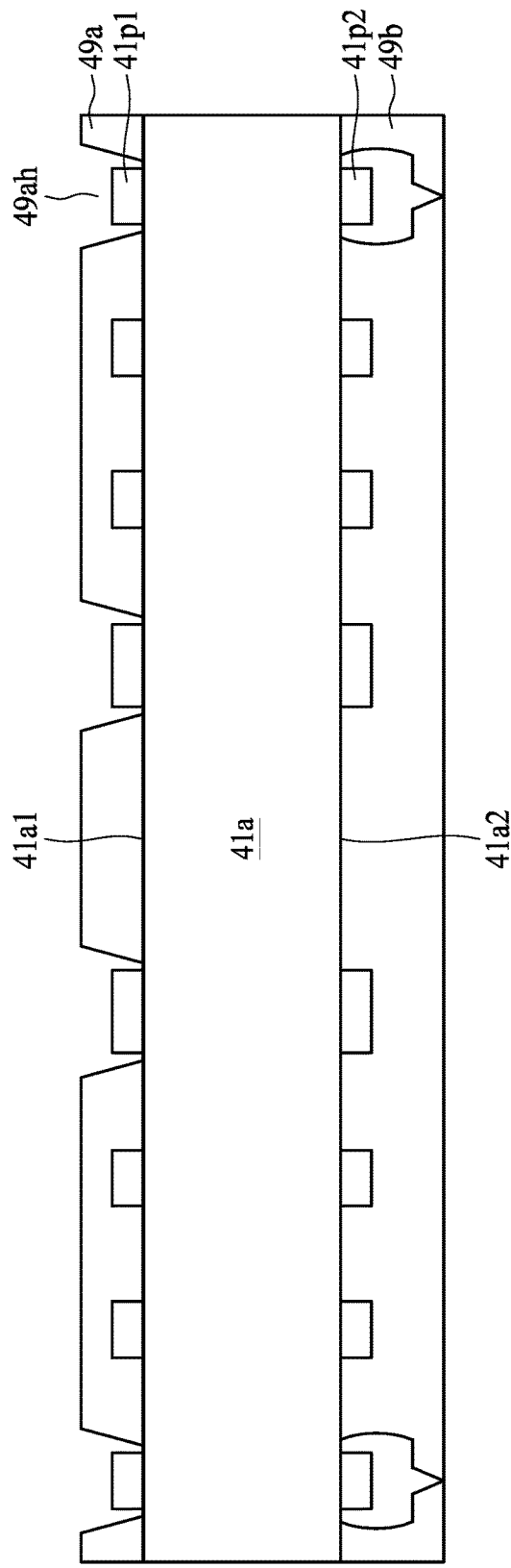
FIG. 4C illustrates one or more stages of a method of manufacturing a semiconductor package device in accordance with some embodiments of the present disclosure.

Referring to FIG. 4C, a photoresist 49b (or mask) is formed on the surface 41a2 of the electronic component 41a to cover the conductive pads 41p2 and the stub bump 45s. The structure is flipped and a plurality of opening 49ah is formed on the passivation layer 49a to expose a portion of the conductive pads 41p1 on the surface 41a1 of the electronic component 41a. In some embodiments, the openings 49ah can be formed by, e.g., lithographic technique.

Figure 4D:
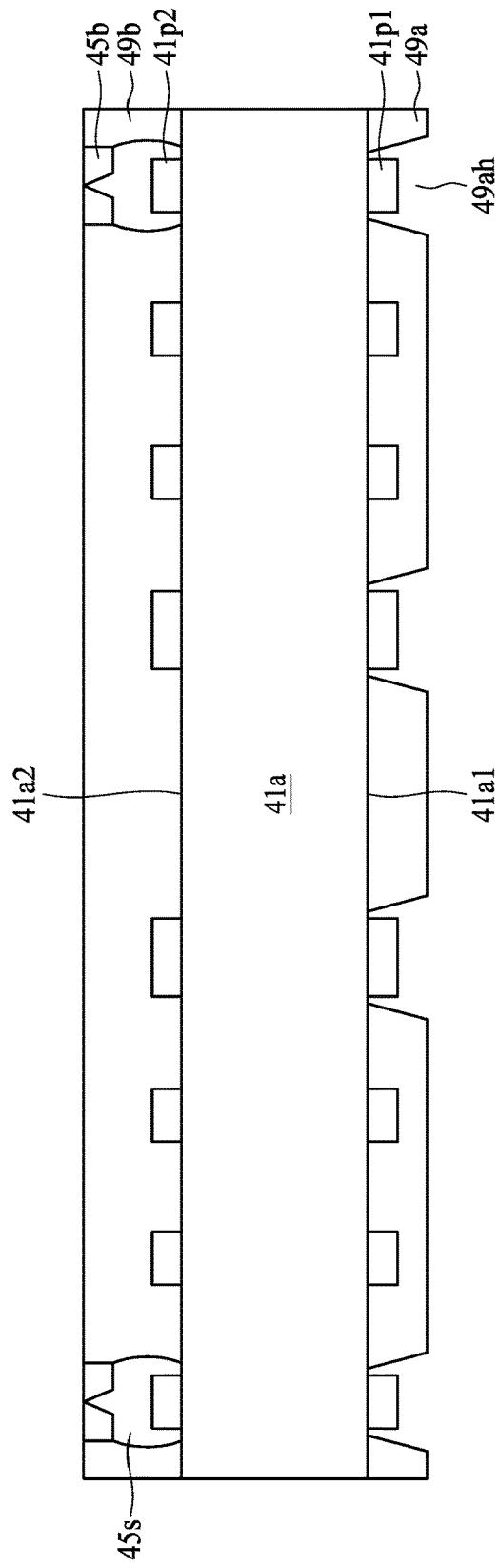
FIG. 4D illustrates one or more stages of a method of manufacturing a semiconductor package device in accordance with some embodiments of the present disclosure.

Referring to FIG. 4D, the structure shown in FIG. 4C is flipped, and openings are formed to on the photoresist 49b to expose the stub bump 45s. The solder layer 45b is formed within the opening to contact the stub bump 45s by, for example, electroplating or electroless plating.

Figure 4E:
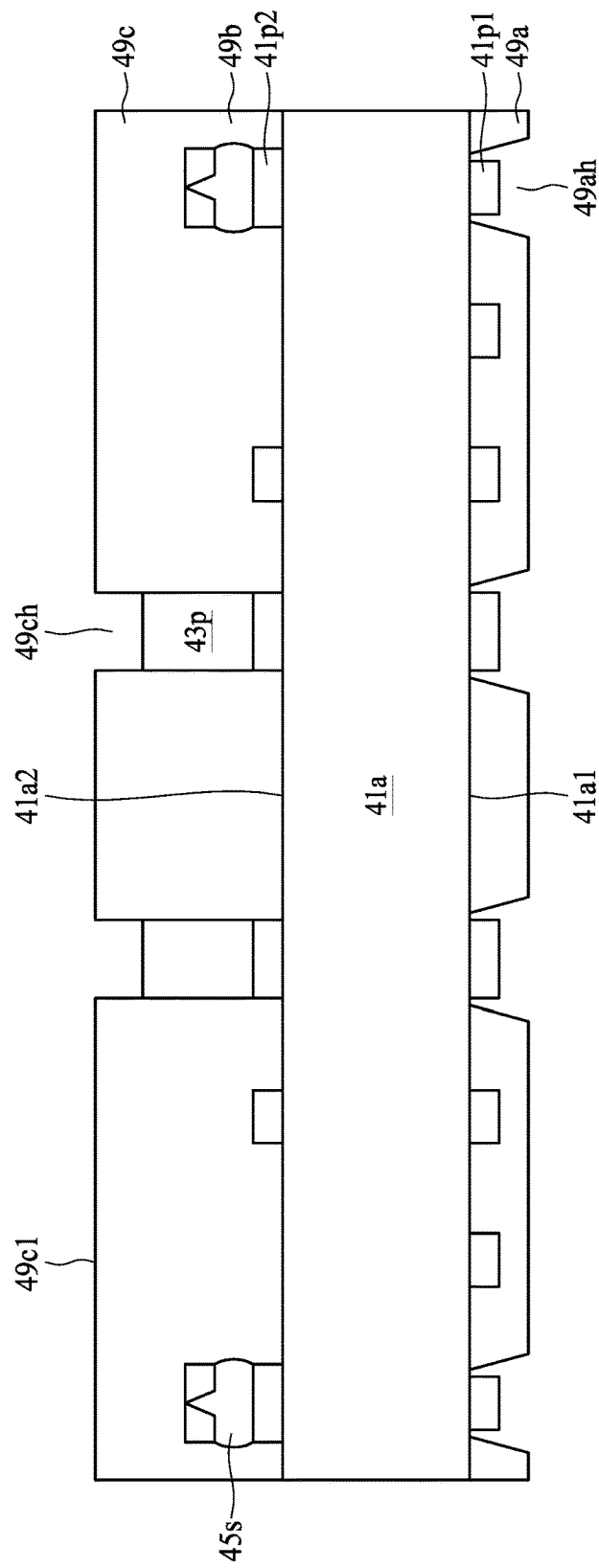
FIG. 4E illustrates one or more stages of a method of manufacturing a semiconductor package device in accordance with some embodiments of the present disclosure.

Referring to FIG. 4E, a photoresist 49c is formed on the photoresist 49b to cover the stub bump 45s and the solder layer 45b. A plurality of openings 49ch are formed on the photoresist 49b to expose a portion of the conductive pads 41p2 on the surface 41a2 of the electronic component 41a. Conductive pillars 43p are formed by forming a conductive material within the openings 49ch by, for example, electroplating, electroless plating, sputtering, paste printing, bumping or bonding process. In some embodiments, the opening 49ch may be not fully filled by the conductive material. For example, a top surface of the conductive pillar 43p may be lower than the surface 49c1 of the passivation layer 49c.

Figure 4F:
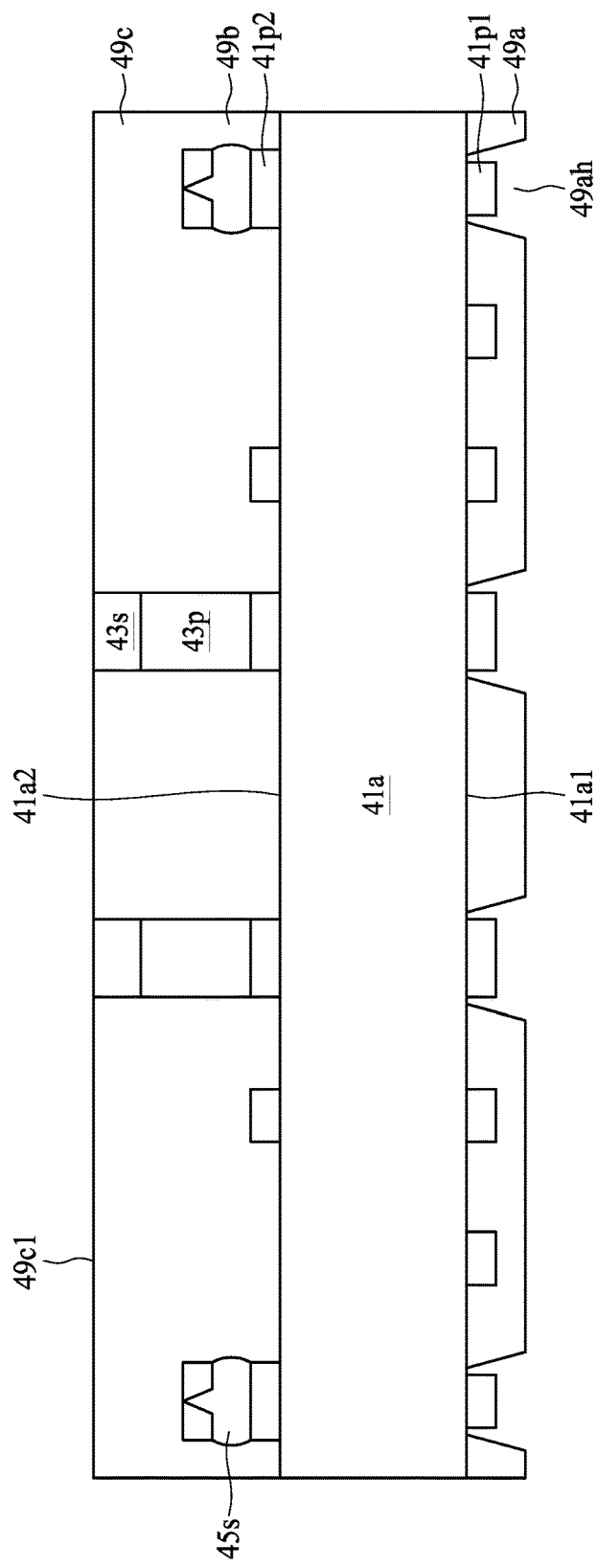
FIG. 4F illustrates one or more stages of a method of manufacturing a semiconductor package device in accordance with some embodiments of the present disclosure.

Referring to FIG. 4F, a solder layer 43s is formed within the remaining portion of the opening 49ch to contact the conductive pillar 43p. In some embodiments, the solder layer 43s is formed by, for example, electroplating or electroless plating.

Figure 4G:
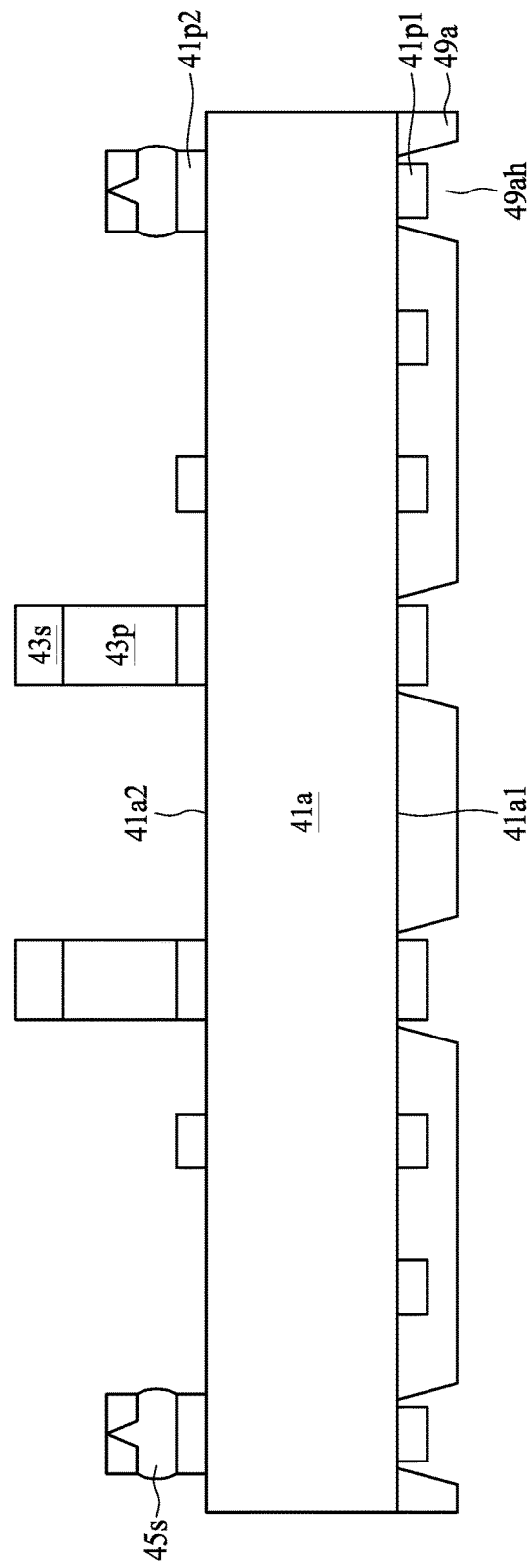
FIG. 4G illustrates one or more stages of a method of manufacturing a semiconductor package device in accordance with some embodiments of the present disclosure.

Referring to FIG. 4G, the photoresists 49b and 49c are removed from the surface 41a2 of the electronic component 41a to expose a portion of the conductive pads 41p1, the stub bump 45s, the conductive pillar 43 and the solder layer 43s.

FIGS. 5A, 5B, 5C and 5D are cross-sectional views of a semiconductor structure fabricated at various stages, in accordance with some embodiments of the present disclosure. Various figures have been simplified for a better understanding of the aspects of the present disclosure.

Figure 5A:
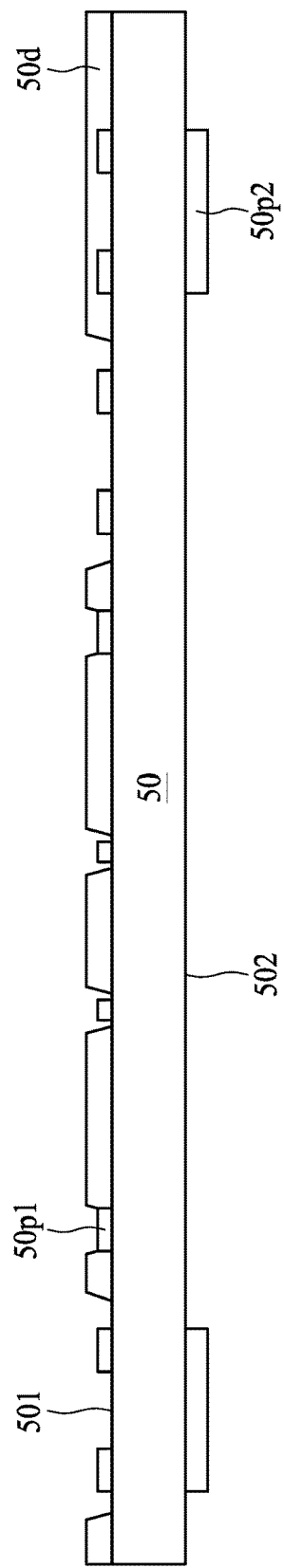
FIG. 5A illustrates one or more stages of a method of manufacturing a semiconductor package device in accordance with some embodiments of the present disclosure.

Referring to FIG. 5A, a carrier 50 is provided. The carrier 50 has a first surface 501 and a second surface 502 opposite to the first surface 501. The carrier 50 has conductive pads 50p1 on its first surface 501 and conductive pads 50p2 on its second surface 502.

A passivation layer 50d is formed on the first surface 501 of the carrier 50 to cover the conductive pads 50p1 on the first surface 501 of the carrier 50. A plurality of openings are formed to expose a portion of the conductive pads 50p1 on the first surface 501 of the carrier 50. In some embodiments, the openings can be formed by, e.g., lithographic technique.

Figure 5B:
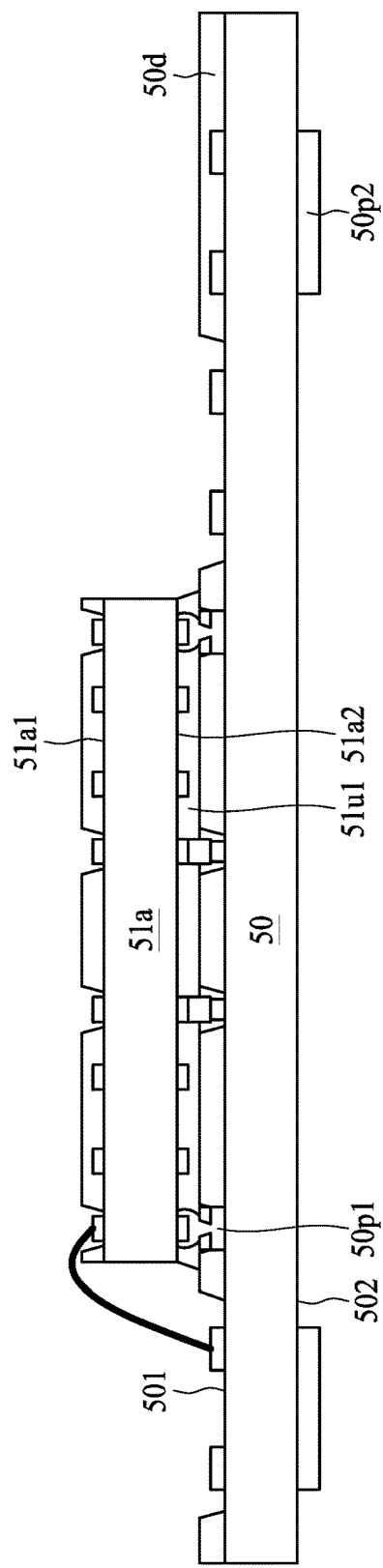
FIG. 5B illustrates one or more stages of a method of manufacturing a semiconductor package device in accordance with some embodiments of the present disclosure.

Referring to FIG. 5B, an electronic component 51a (die or chip) is placed on the first surface 501 of the carrier 50. The electronic component 51a is double-sided and has a first surface 51a1 and a second surface 51a2 facing toward the carrier 50. In some embodiments, the electronic component 51a and the connection structure thereof can be formed by the operations shown in FIGS. 4A-4G, and thus the conducive pillars on the second surface 51a2 of the electronic component 51a are electrically connected to the conductive pads 50p1 on the first surface 501 of the carrier 50. The first surface 51a1 of the electronic component 51a is electrically connected to the carrier 50 through wire bonding technique.

In some embodiments, underfill 51u1 may be formed between the electronic component 51a and the carrier 50 to cover the second surface 51a2 of the electronic component 51a. In some embodiments, the underfill 51u1 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 51u1 may be CUF or MUF depending on different embodiments.

Figure 5C:
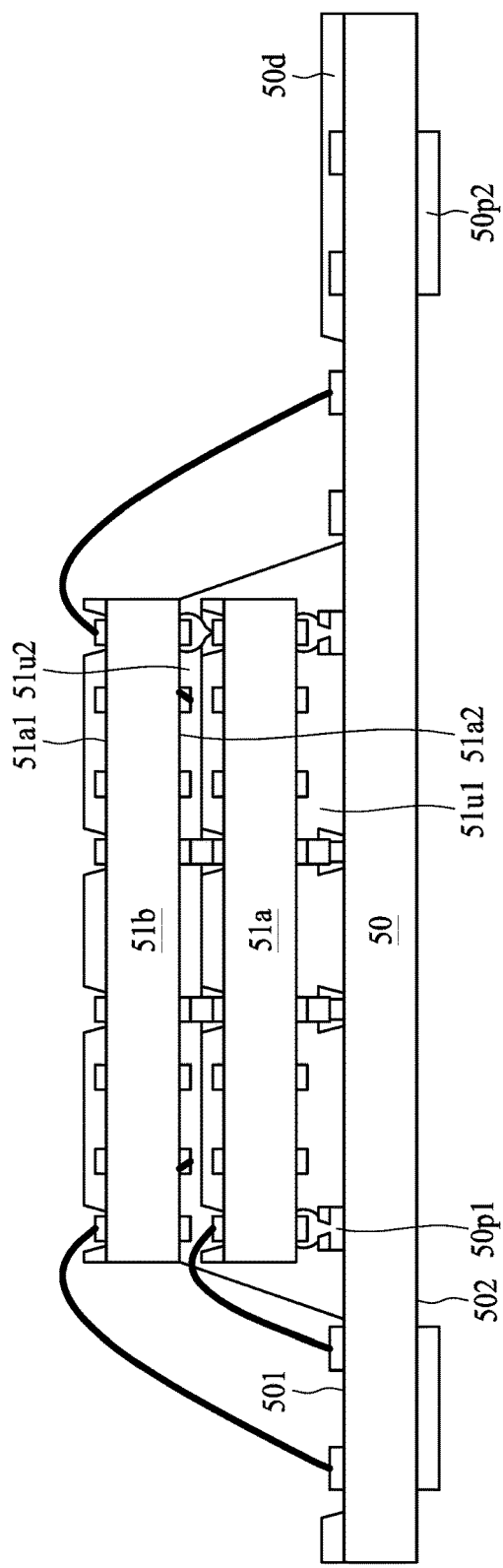
FIG. 5C illustrates one or more stages of a method of manufacturing a semiconductor package device in accordance with some embodiments of the present disclosure.

Referring to FIG. 5C, an electronic component 51b (die or chip) is placed on the first surface 51a1 of the electronic component 51a. The electronic component 51b is double-sided and has a first surface 51b1 and a second surface 51b2 facing toward the electronic component 51a. In some embodiments, the electronic component 51b and the connection structure thereof can be formed by the operations shown in FIGS. 4A-4G, and thus the conducive pillars on the second surface 51b2 of the electronic component 51b are electrically connected to the conductive pads on the first surface 51a1 of the electronic component 51a. The first surface 51b1 of the electronic component 51b is electrically connected to the carrier 50 through wire bonding technique.

In some embodiments, underfill 51u2 may be formed between the electronic components 51a and 51b to cover the first surface 51a1 of the electronic component 51a and the second surface 51b2 of the electronic component 51b. In some embodiments, the underfill 51u2 includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 51u2 may be CUF or MUF depending on different embodiments.

Figure 5D:
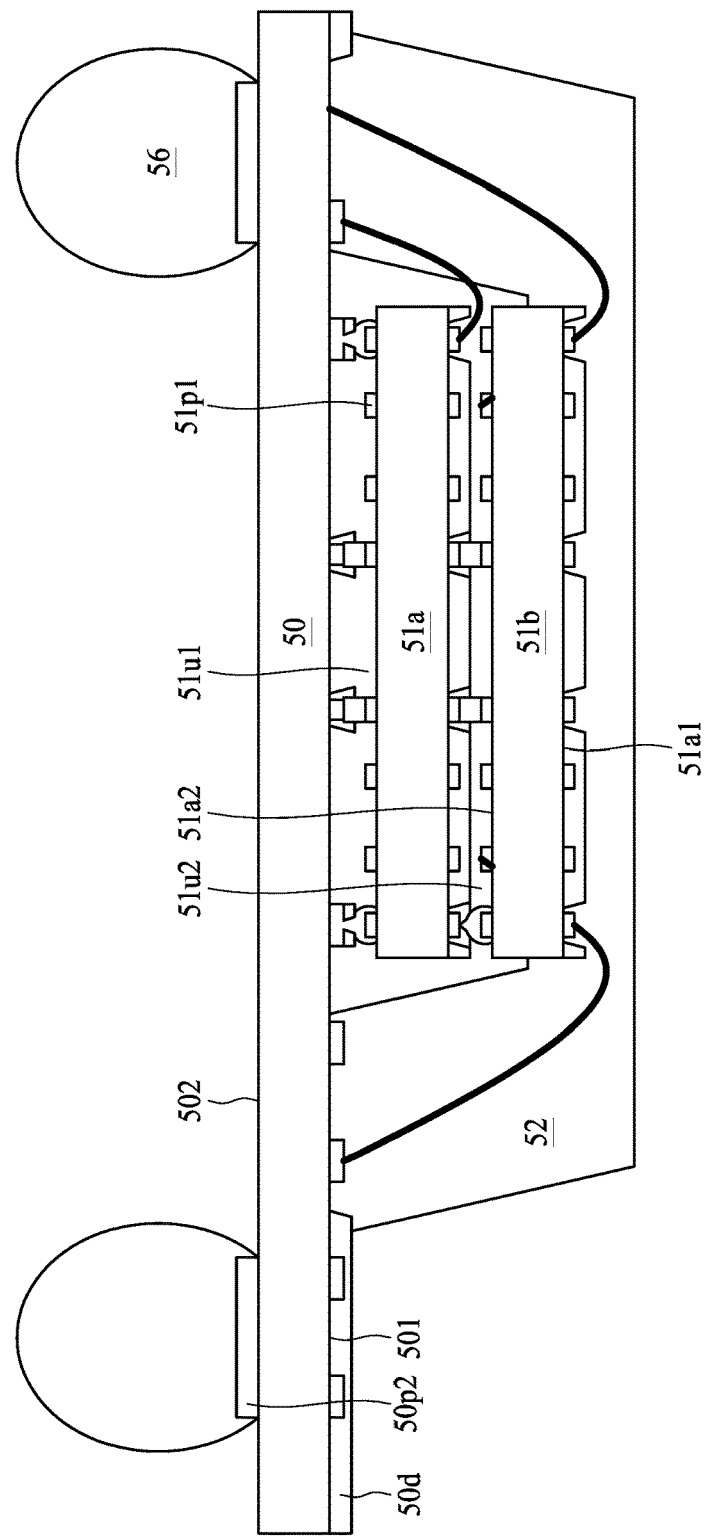
FIG. 5D illustrates one or more stages of a method of manufacturing a semiconductor package device in accordance with some embodiments of the present disclosure.

Referring to FIG. 5D, a package body 52 is formed on the first surface 501 of the carrier 50 to cover the electronic components 51a, 51b and the underfills 51u1, 51u2. In some embodiments, the package body 52 includes, for example, organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid and/or dry-film materials, or a combination of two or more thereof. The package body 52 may be formed by a molding technique, such as transfer molding or compression molding.

After the formation of the package body 52, the device is flipped and electrical contacts 56 are formed on the conductive pads 50p2 on the second surface 502 of the carrier 50. In some embodiments, the electrical contacts 56 are C4 bumps, BGA or LGA. In some embodiments, in the electrical contacts 56 can be formed by electroplating, electroless plating, sputtering, paste printing, bumping or bonding process. In some embodiments, the semiconductor package device 5 shown in FIG. 5D is similar to the semiconductor package device 1 shown in FIG. 1A except that the electronic component 11b of the semiconductor package device 1 is single-sided while the electronic component 51b of the semiconductor package device 5 is double-sided.

In some embodiments, as shown in FIGS. 5B and 5C, the electronic component 51a is connected to the carrier 50 and the electronic component 51b is connected to the electronic component 51a. When the electronic component 51a is connected to the carrier 50, a reflow process is performed. When the electronic component 51b is connected to the electronic component 51a, another reflow process is performed. In other words, the solder layer of the connection structure (similar to the connection structure 13 shown in FIGS. 1B-1F) between the electronic component 51a and the carrier 50 may sustain reflow processes twice. To avoid the warpage of the carrier 50 and the misalignment between the conductive pillar of the electronic component 51a and the conductive pad on the carrier 50, a melting point of the solder layer between the electronic component 51a and the carrier 50 may be higher than a melting point of the solder layer between the electronic component 51b and the electronic component 51a (similar to the connection structure 14 shown in FIGS. 1G-1K) or a melting point of the electrical contacts 56. Therefore, a distance (e.g., D1 shown in FIGS. 1B-1F) between the conductive pillar of the electronic component 51a and the conductive pad of the carrier 50 is greater than a distance (e.g., D2 shown in FIGS. 1G-1K) between the conductive pillar of the electronic component 51b and the conductive pad of the electronic component 51a.

In addition, since the solder layer of the connection structure (similar to the connection structure 13 shown in FIGS. 1B-1F) between the electronic component 51a and the carrier 50 may sustain reflow processes twice, a thickness of the conductive pad on the carrier 50 may be greater than a thickness of the conductive pad on the electronic component 51a or a thickness of the conductive pad on which the electrical contact 56 is disposed, to avoid the conductive pad on the carrier 50 from being completely converted to IMC.

In some embodiments, the electronic component 51b can be connected to the electronic component 51a first, and the electronic component 51a along with the electronic component 51b is connected to the carrier 50. When the electronic component 51b is connected to the electronic component 51a, a reflow process is performed. When the electronic components 51a, 51b are connected to the carrier 50, another reflow process is performed. In other words, the solder layer of the connection structure (similar to the connection structure 14 shown in FIGS. 1G-1K) between the electronic component 51a and the electronic component 51b may sustain reflow processes twice. To avoid the warpage of the electronic component 51a or 51b and the misalignment between the conductive pillar of the electronic component 51b and the conductive pad on the electronic component 51a, a melting point of the solder layer between the electronic component 51a and the electronic component 51b may be higher than a melting point of the solder layer between the electronic component 51a and the carrier 50 (similar to the connection structure 13 shown in FIGS. 1B-1F) or a melting point of the electrical contacts 56. Therefore, a distance (e.g., D2 shown in FIGS. 1G-1K) between the conductive pillar of the electronic component 51b and the conductive pad of the electronic component 51a is greater than a distance (e.g., D1 shown in FIGS. 1B-1F) between the conductive pillar of the electronic component 51a and the conductive pad on the carrier 50.

In addition, since the solder layer of the connection structure (similar to the connection structure 14 shown in FIGS. 1G-1K) between the electronic component 51a and the electronic component 51b may sustain reflow processes twice, a thickness of the conductive pad on the electronic component 51a may be greater than a thickness of the conductive pad on the carrier 50 or a thickness of the conductive pad on which the electrical contact 56 is disposed, to avoid the conductive pad on the electronic component 51a from being completely converted to IMC.

FIGS. 6A, 6B, 6C, 6D, 6E, 6F, 6G, 6H and 6I are cross-sectional views of a semiconductor structure fabricated at various stages, in accordance with some embodiments of the present disclosure. Various figures have been simplified for a better understanding of the aspects of the present disclosure.

Figure 6A:
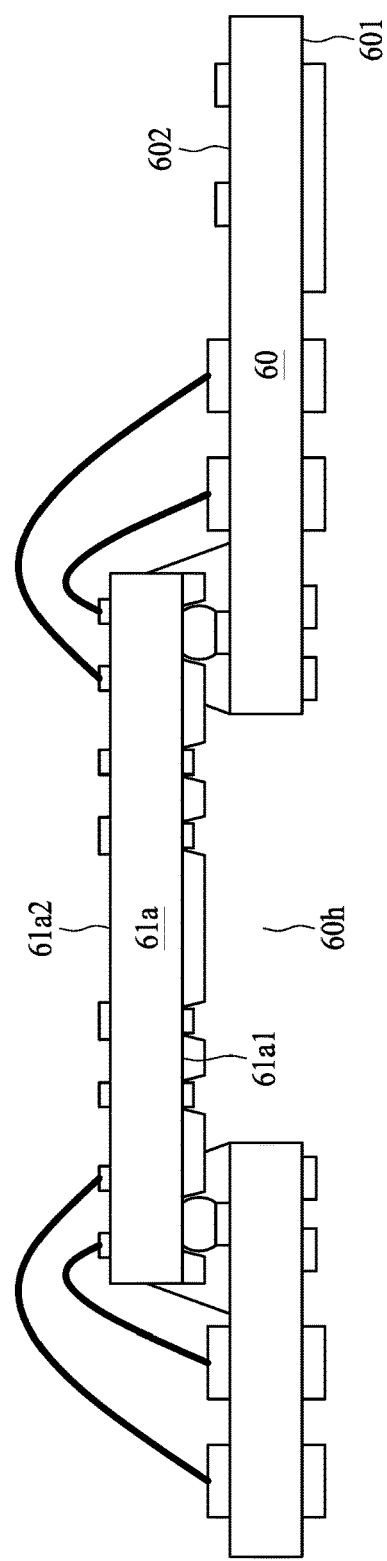
FIG. 6A illustrates one or more stages of a method of manufacturing a semiconductor package device in accordance with some embodiments of the present disclosure.

Referring to FIG. 6A, a carrier 60 is provided. The carrier 60 defines an opening 60h penetrating of the carrier 60. In some embodiments, the opening 60h can be formed by mechanical drilling, laser drilling or other suitable processes. The carrier 60 has a first surface 601 and a second surface 602 opposite to the first surface 601. The carrier 60 may include multiple conductive pads on its first surface 601 and second surface 602.

An electronic component 61a (die or chip) is placed on the second surface 602 of the carrier 60 and across the opening 60h. In some embodiments, the electronic component 61a is a double-sided electronic component. The electronic component 61a has a first surface 60a1 facing toward the carrier 60 and a second surface 60a2 opposite to the first surface 60a1. The first surface 61a1 of the electronic component 61a is electrically connected to the second surface 602 of the carrier 60 through, e.g., flip-chip technique, while the second surface 61a2 of the electronic component 61a is electrically connected to the second surface 602 of the carrier 60 through, e.g., wire bonding technique.

Figure 6B:
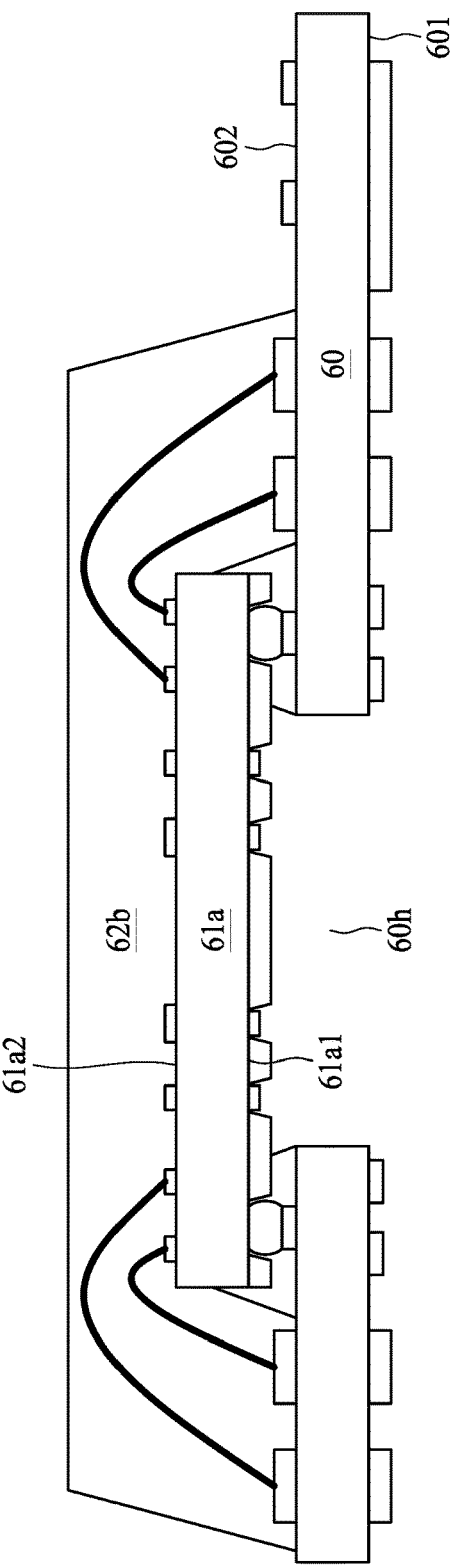
FIG. 6B illustrates one or more stages of a method of manufacturing a semiconductor package device in accordance with some embodiments of the present disclosure.

Referring FIG. 6B, a package body 62b is formed on the second surface 602 of the carrier 60 to cover the second surface 61a2 of the electronic component 61a and to expose the first surface 61a1 of the electronic component 61a. In some embodiments, the package body 62b includes, for example, organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid and/or dry-film materials, or a combination of two or more thereof. The package body 62b may be formed by a molding technique, such as transfer molding or compression molding.

Figure 6C:
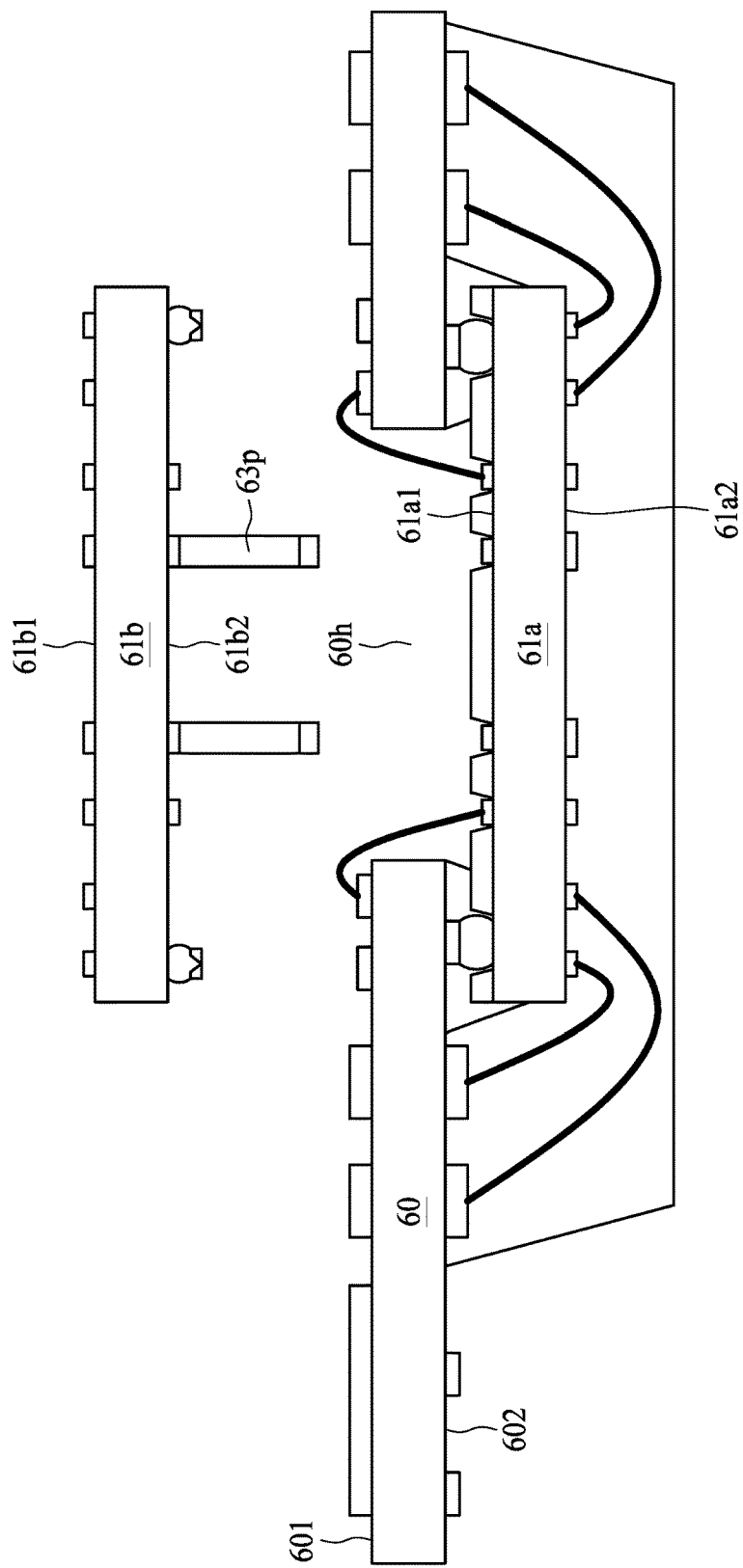
FIG. 6C illustrates one or more stages of a method of manufacturing a semiconductor package device in accordance with some embodiments of the present disclosure.

Referring to FIG. 6C, the structure shown in FIG. 6B is flipped, and the first surface 60a1 of the electronic component 61a is electrically connected to the first surface 601 of the carrier 60 through wire bonding technique.

An electronic component 61b is placed on the first surface 601 of the carrier 60 and across the opening 60h. The electronic component 61b is double-sided and has a first surface 61b1 and a second surface 61b2 facing toward the electronic component 61a. In some embodiments, the electronic component 61b and the connection structure thereof can be formed by the operations shown in FIGS. 4A-4G. The conducive pillars 63p on the second surface 61b2 of the electronic component 61b pass through the opening 60h and are electrically connected to the conductive pads on the first surface 61a1 of the electronic component 61a.

Figure 6D:
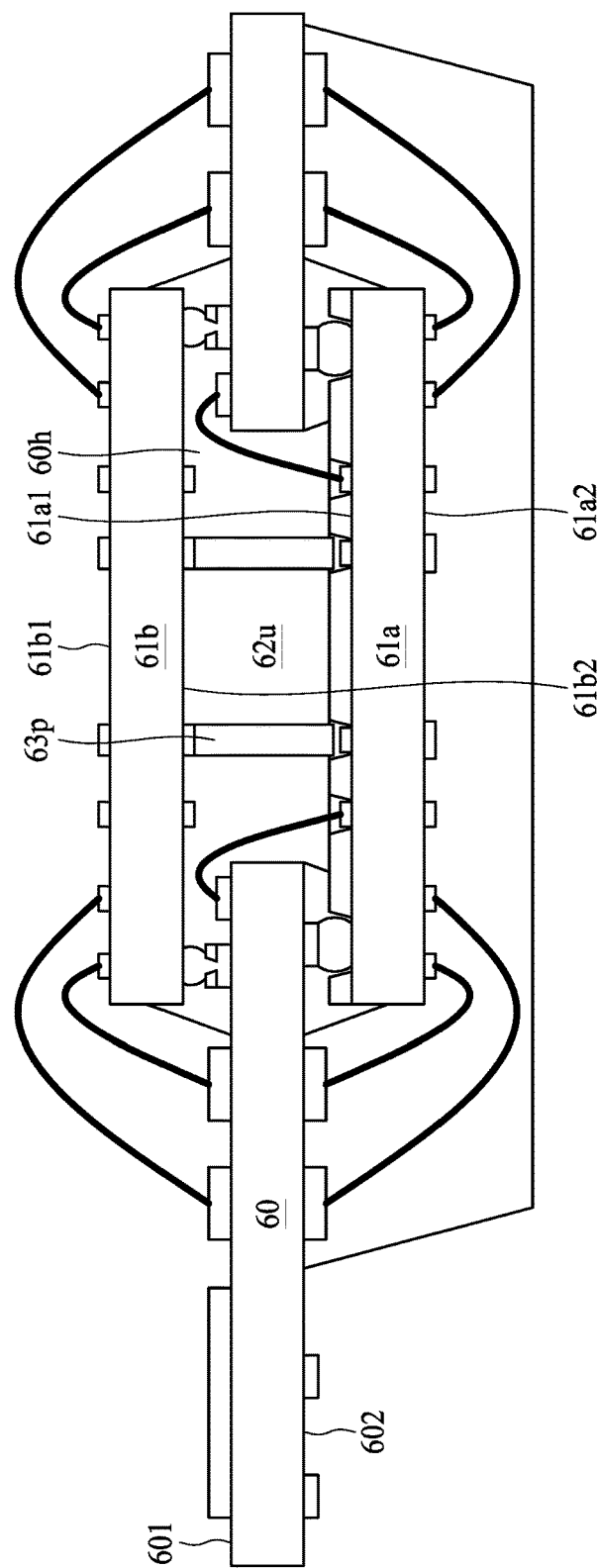
FIG. 6D illustrates one or more stages of a method of manufacturing a semiconductor package device in accordance with some embodiments of the present disclosure.

Referring to FIG. 6D, underfill 62u is formed between the electronic components 61a and 61b to cover the first surface 61a1 of the electronic component 61a and the second surface 61b2 of the electronic component 61b. In some embodiments, the underfill 62u includes an epoxy resin, a molding compound (e.g., an epoxy molding compound or other molding compound), a polyimide, a phenolic compound or material, a material including a silicone dispersed therein, or a combination of two or more thereof. In some embodiments, the underfill 62u may be CUF or MUF depending on different embodiments. The first surface 61b1 of the electronic component 61b is electrically connected to the carrier 50 through wire bonding technique.

Referring FIG. 6D, a package body 62a is formed on the first surface 601 of the carrier 60 to cover the first surface 61b1 of the electronic component 61b. In some embodiments, the package body 62a includes, for example, organic materials (e.g., molding compound, BT, PI, PBO, solder resist, ABF, PP, epoxy-based material, or a combination of two or more thereof), inorganic materials (e.g., silicon, glass, ceramic, quartz, or a combination of two or more thereof), liquid and/or dry-film materials, or a combination of two or more thereof. The package body 62a may be formed by a molding technique, such as transfer molding or compression molding.

Figure 6E:
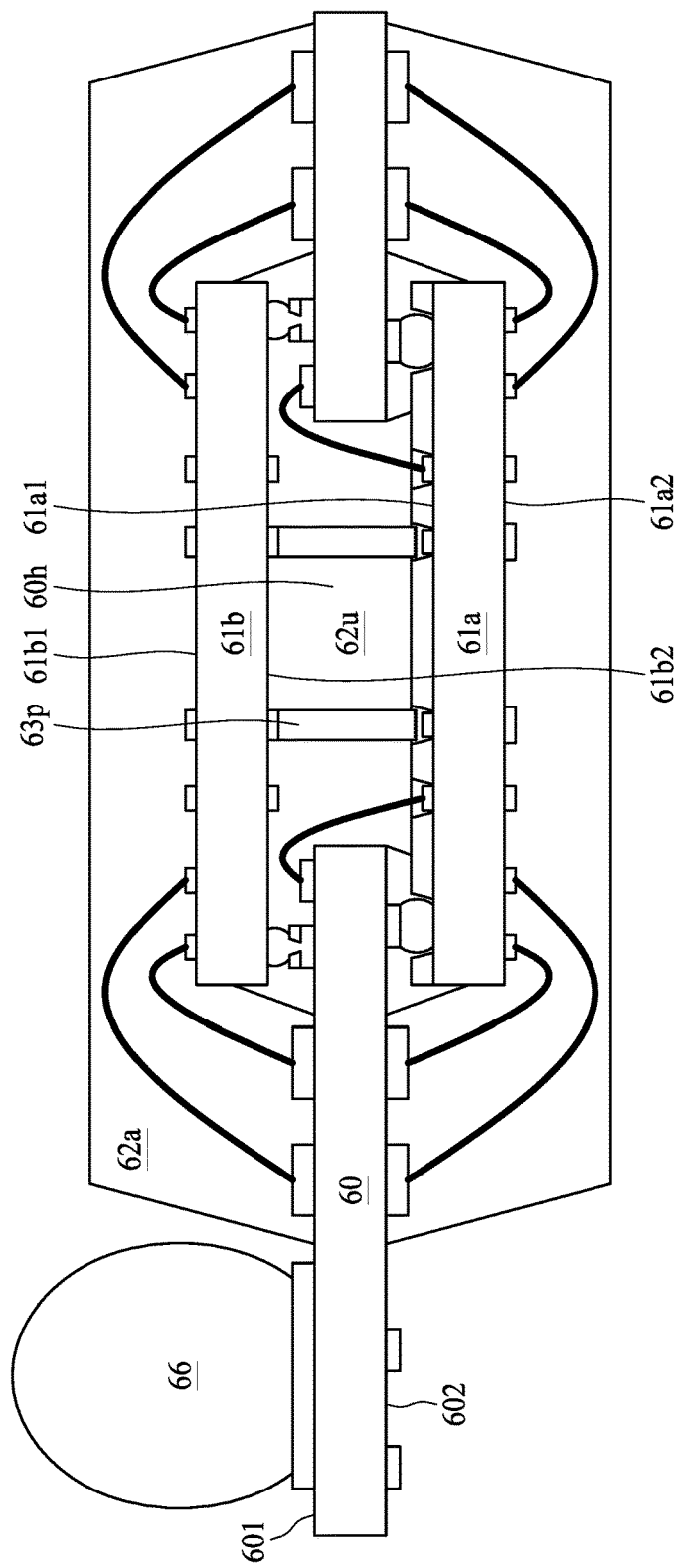
FIG. 6E illustrates one or more stages of a method of manufacturing a semiconductor package device in accordance with some embodiments of the present disclosure.

Electrical contacts 66 are formed on the conductive pads on the first surface 601 of the carrier 60. In some embodiments, the electrical contacts 66 are C4 bumps, BGA or LGA. In some embodiments, in the electrical contacts 66 can be formed by electroplating, electroless plating, sputtering, paste printing, bumping or bonding process. In some embodiments, the semiconductor package device 6 shown in FIG. 6E is the same as the semiconductor package device 3 shown in FIG. 3.

In some embodiments, as shown in FIGS. 6A-6E, the electronic component 61a is connected to the second surface 602 of the carrier 60 and the electronic component 61b is connected to the first surface 601 of the carrier 60. When the electronic component 61a is connected to the carrier 60, a reflow process is performed. When the electronic component 61b is connected to the carrier 60, another reflow process is performed. In other words, the solder layer of the connection structure (similar to the connection structure 13 shown in FIGS. 1B-1F) between the electronic component 61a and the carrier 60 may sustain reflow processes twice. Therefore, a thickness of the conductive pad on the second surface 602 of the carrier 60 may be greater than a thickness of the conductive pad on the electronic component 61a or a thickness of the conductive pad on which the electrical contact 66 is disposed, to avoid the conductive pad on the second surface 602 of the carrier 60 from being completely converted to IMC.

Figure 7B:
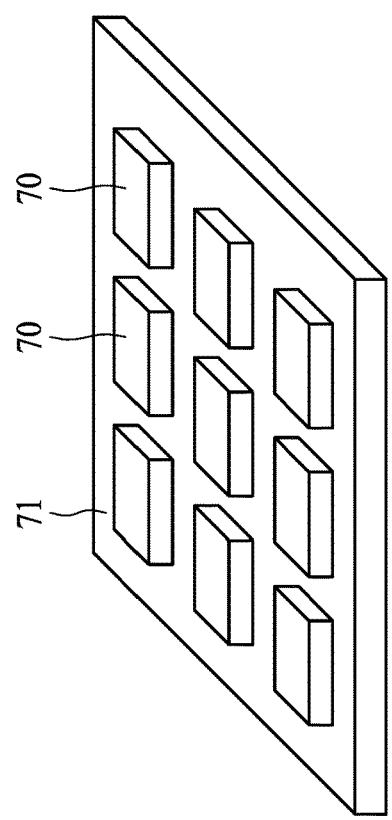
FIG. 7B illustrates various types of semiconductor package devices in accordance with some embodiments of the present disclosure.
Figure 7A:
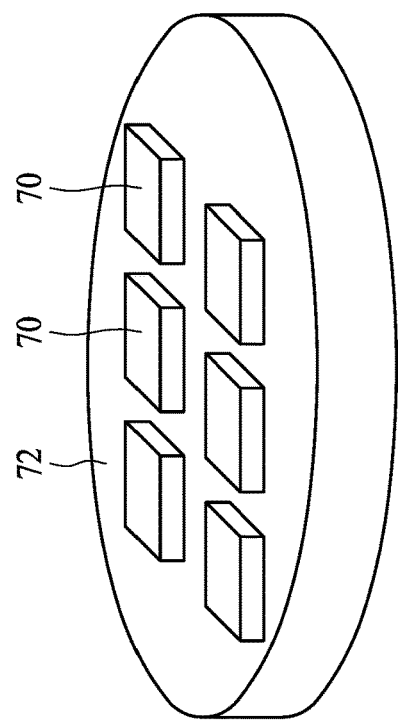
FIG. 7A illustrates various types of semiconductor package devices in accordance with some embodiments of the present disclosure.

FIGS. 7A and 7B illustrate various types of semiconductor package devices in accordance with some embodiments of the present disclosure.

As shown in FIG. 7A, a plurality of chips 70 or dies are placed on a square-shaped carrier 71. In some embodiments, the carrier 71 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As shown in FIG. 7B, a plurality of chips 70 or dies are placed on a circle-shaped carrier 72. In some embodiments, the carrier 72 may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof), or a combination of two or more thereof.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
a first dielectric layer having a first surface and a second surface opposite to the first surface, the first dielectric layer defining a first opening tapered from the first surface toward the second surface;

a first conductive pad within the first opening and adjacent to the second surface of the first dielectric layer;

a first conductive element, wherein at least a portion of the first conductive element is disposed within the first opening, and the first conductive element is engaged with a sidewall of the first opening, the first conductive element having a first surface facing toward the first conductive pad, wherein the first surface of the first conductive element is spaced apart from the first conductive pad.

2. The semiconductor package device of claim 1, wherein the conductive element further includes a first portion and a second portion;

the second portion of the conductive element is engaged with the sidewall of the first opening; and the first portion and the second portion of the first conductive element comprise different materials.

3. The semiconductor package device of claim 2, wherein the first conductive pad comprises a first portion and a second portion covering the first portion; and the first portion and the second portion of the first conductive pad comprise different materials.

4. The semiconductor package device of claim 3, further comprising a first solder layer between the first conductive element and the first conductive pad, wherein the first solder layer comprises a first portion adjacent to the second portion of the first conductive element, a second portion adjacent to the second portion of the first conductive pad, and a third portion.

5. The semiconductor package device of claim 4, wherein
the first portion of the first solder layer and the second portion of the first conductive element form a first intermetallic compounds (IMC) layer;

the second portion of the first solder layer and the second portion of the first conductive pad form a second IMC layer; and a distance between the first surface of the first conductive element and the first conductive pad is greater than a half of a sum of a thickness of the first IMC layer and a thickness of the second IMC layer.

6. The semiconductor package device of claim 5, wherein the first IMC layer contacts the second IMC layer.

7. The semiconductor package device of claim 4, further comprising:
a carrier having a first surface on which the first dielectric layer and the first conductive pad are disposed, wherein the second surface of the first dielectric layer is facing toward the carrier; and a first electronic component on the first dielectric layer, the first electronic component having a first surface facing toward the first dielectric layer and a second surface opposite to the first surface, wherein the first surface of the first electronic component is electrically connected to the first conductive element.

8. The semiconductor package device of claim 7, further comprising:
a second conductive pad on the second surface of the first electronic component;

a second dielectric layer on the second surface of the first electronic component, the second dielectric layer defining a second opening tapering toward the second surface of the first electronic component to expose the second conductive pad; and a second conductive element, wherein at least a portion of the second conductive element is within the second opening, and the second conducive element is engaged with a sidewall of the second opening, the second conductive element having a first surface facing toward the second conductive pad.

9. The semiconductor package device of claim 8, wherein a distance between the first surface of the first conductive element and the first conductive pad is less than a distance between the first surface of the second conductive element and the second conductive pad.

10. The semiconductor package device of claim 8, wherein a thickness of the first conductive pad is greater than a thickness of the second conductive pad.

11. The semiconductor package device of claim 10, further comprising a third conductive pad on a second surface of the carrier opposite to the first surface, wherein a thickness of the third conductive pad is less than the thickness of the first conductive pad or the thickness of the second conductive pad.

12. The semiconductor package device of claim 8, wherein
the second conductive element comprises a first portion and a second portion that are formed of different materials;

the second portion of the second conductive element is engaged with the sidewall of the second opening; and the second conductive pad comprises a first portion and a second portion covering the first portion that are formed of different materials.

13. The semiconductor package device of claim 12, further comprising a second solder layer between the second conductive element and the second conductive pad, wherein the second solder layer comprises a first portion adjacent to the second portion of the second conductive element, a second portion adjacent to the second portion of the second conductive pad, and a third portion.

14. The semiconductor package device of claim 13, wherein
the first portion of the second solder layer and the second portion of the second conductive element form a third IMC layer;

the second portion of the second solder layer and the second portion of the second conductive pad form a fourth IMC layer; and a distance between the first surface of the second conductive element and the second conductive pad is greater than a half of a sum of a thickness of the third IMC layer and a thickness of the fourth IMC layer.

15. The semiconductor package device of claim 13, wherein a melting point of the first solder layer is greater than a melting point of the second solder layer.

16. The semiconductor package device of claim 15, further comprising a third solder layer on a second surface of the carrier opposite to the first surface, wherein the melting point of the third solder layer is less than the melting point of the first solder layer or the second solder layer.

17. The semiconductor package device of claim 8, further comprising a second electronic component on the second dielectric layer, the second electronic component having a first surface facing toward the second dielectric layer, wherein the first surface of the second electronic component is electrically connected to the second conductive element.

18. The semiconductor package device of claim 4, further comprising a third electronic component having a first surface and a second surface opposite to the first surface, wherein the first dielectric layer and the first conductive pad are on the first surface of the third electronic component and the second surface of the first dielectric layer is facing toward the first surface of the third electronic component.

19. The semiconductor package device of claim 18, wherein
the first portion of the first solder layer and the second portion of the first conductive element form a fifth IMC layer;
the second portion of the first solder layer and the second portion of the first conductive pad form a sixth IMC layer; and
a distance between the first surface of the first conductive element and the first conductive pad is greater than a half of a sum of a thickness of the fifth IMC layer and a thickness of the sixth IMC layer.

20. The semiconductor package device of claim 18, further comprising a fourth electronic component over the third electronic component, the fourth electronic component having a first surface facing toward the third electronic component, wherein the first surface of the fourth electronic component is electrically connected to the first conductive element.

21. The semiconductor package device of claim 20, further comprising a substrate between the third electronic component and the fourth electronic component, the substrate having a first surface facing toward the first surface of the fourth electronic component and a second surface facing toward the first surface of the third electronic component.

22. The semiconductor package device of claim 21, wherein the substrate comprises a conductive pad on the second surface of the substrate, and a thickness of the conductive pad on the second surface of the substrate is greater than a thickness of the first conductive pad.

23. The semiconductor package device of claim 22, wherein the substrate comprises a conductive pad on the first surface of the substrate, and a thickness of the conductive pad on the first surface of the substrate is less than the thickness of the conductive pad on the second surface of the substrate or the thickness of the first conductive pad.

24. The semiconductor package device of claim 21, further comprising a first conductive wire and a second conductive wire, wherein the first surface of the substrate is electrically connected to a second surface opposite to the first surface of the fourth electronic component by the first conductive wire, and the second surface of the substrate is electrically connected to a second surface opposite to the first surface of the third electronic component by the second conductive wire.

25. The semiconductor package device of claim 1, wherein a distance (D1) between the first surface of the first conductive element and the first conductive pad is according to the following equation:

$$D1 = \frac{1}{2}(R1 - r1) \times \tan\theta1$$

wherein R1 is a radius of the first conductive element, r1 is a radius of a bottom portion of the first opening, and θ1 is an angle defined by the sidewall of the first opening and the second surface of the first dielectric layer.

26. A semiconductor package device, comprising:
a dielectric layer having a first surface and a second surface opposite to the first surface, the dielectric layer defining an opening tapered from the first surface toward the second surface;
a conductive pad within the opening and adjacent to the second surface of the dielectric layer;
a conductive pillar, wherein at least a portion of the conductive pillar is within the opening, and the conductive pillar has a first surface facing toward the conductive pad;
a first intermetallic compounds (IMC) layer on the first surface of the conductive pillar and extending from the first surface of the conductive pillar into the conductive pillar, wherein the first IMC layer is engaged with a sidewall of the opening; and
a second IMC layer on the conductive pad and extending into the conductive pad,
wherein a distance between the first surface of the conductive pillar and the conductive pad is greater than a half of a sum of a thickness of the first IMC layer and a thickness of the second IMC layer.

27. The semiconductor package device of claim 26, further comprising a solder layer between the first IMC layer and the second IMC layer.

28. The semiconductor package device of claim 26, wherein the first IMC layer contacts the second IMC layer.

29. A semiconductor package device, comprising:
a dielectric layer having a first surface and a second surface opposite to the first surface, the dielectric layer defining an opening tapered from the first surface toward the second surface;
a conductive pad within the opening and adjacent to the second surface of the dielectric layer;
a conductive pillar, wherein at least a part of the conductive pillar is within the opening, the conductive pillar has a first portion and a second portion on the first portion, and a width of the first portion of the conductive pillar is less than a width of the second portion of the conductive pillar; and
a first intermetallic compounds (IMC) layer covering the first portion of the conductive pillar.

30. The semiconductor package device of claim 29, further comprising a second IMC layer covering the conductive pad.

31. The semiconductor package device of claim 30, further comprising a solder layer between the first IMC layer and the second IMC layer.

32. The semiconductor package device of claim 30, wherein the first IMC layer contacts the second IMC layer.

* * * * *